(12) United States Patent
Qing et al.

(10) Patent No.: US 11,721,267 B2
(45) Date of Patent: Aug. 8, 2023

(54) DISPLAY PANEL INCLUDING COMMON CONNECTION TERMINAL CONNECTED TO A PLURALITY OF TRANSISTORS, METHOD OF MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Haigang Qing, Beijing (CN); Yunsheng Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/043,599

(22) PCT Filed: Nov. 20, 2019

(86) PCT No.: PCT/CN2019/119707
§ 371 (c)(1),
(2) Date: Jan. 20, 2022

(87) PCT Pub. No.: WO2021/097710
PCT Pub. Date: May 27, 2021

(65) Prior Publication Data
US 2021/0304659 A1    Sep. 30, 2021

(51) Int. Cl.
*G09G 3/20*        (2006.01)
*G09G 3/3266*    (2016.01)
(Continued)

(52) U.S. Cl.
CPC ......... *G09G 3/2092* (2013.01); *G09G 3/3266* (2013.01); *G09G 2300/0408* (2013.01);
(Continued)

(58) Field of Classification Search
CPC ............... G09G 3/2092; G09G 3/3266; G09G 2300/0408; G09G 2300/0426;
(Continued)

(56) References Cited

U.S. PATENT DOCUMENTS

2003/0222311 A1    12/2003  Kim
2007/0222718 A1    9/2007   Takahara
(Continued)

FOREIGN PATENT DOCUMENTS

KR    20120065788 A    6/2012
WO    2007080813 A1    7/2007

OTHER PUBLICATIONS

Intellectual Property India, Examination Report Issued in Application No. 202147059604, dated Jul. 5, 2022, 6 pages.
(Continued)

*Primary Examiner* — Adam J Snyder
(74) *Attorney, Agent, or Firm* — McCoy Russell LLP

(57) ABSTRACT

A display substrate includes a substrate and a gate driving circuit provided on the substrate; the gate driving circuit includes: a frame start signal line, a clock signal line, an inverted clock signal line, a first level signal line, a second level signal line, and a plurality of shift register units. The plurality of transistors at least include a first transistor, a second transistor, and a third transistor, active layers of the first, second and third transistors are formed by a continuous first semiconductor layer, the first semiconductor layer extends along a first direction; the first semiconductor layer includes at least three channel portions corresponding to the first transistor, the second transistor and the third transistor,
(Continued)

and a conductive portion provided between adjacent channel portions, transistors corresponding to the adjacent channel portions are coupled to each other through a corresponding conductive portion.

23 Claims, 4 Drawing Sheets

(51) Int. Cl.
*G11C 19/28* (2006.01)
*H10K 71/00* (2023.01)

(52) U.S. Cl.
CPC .............. *G09G 2300/0426* (2013.01); *G09G 2300/0809* (2013.01); *G09G 2310/0286* (2013.01); *G09G 2310/08* (2013.01); *G11C 19/28* (2013.01); *H10K 71/00* (2023.02)

(58) Field of Classification Search
CPC ... G09G 2300/0809; G09G 2310/0286; G09G 2310/08; G11C 19/28; H01L 51/56
See application file for complete search history.

(56) References Cited

U.S. PATENT DOCUMENTS

| 2012/0121061 | A1 | 5/2012 | Sakamoto et al. |
| 2012/0146978 | A1 | 6/2012 | Park et al. |
| 2019/0304374 | A1* | 10/2019 | Wang ................ G09G 3/3266 |
| 2019/0318693 | A1* | 10/2019 | Jung ................ G09G 3/3266 |

OTHER PUBLICATIONS

European Patent Office, Partial Supplementary European Search Report Issued in Application No. 19947420.6, dated Oct. 19, 2022, Germany, 15 pages.

* cited by examiner

DISPLAY PANEL INCLUDING COMMON CONNECTION TERMINAL CONNECTED TO A PLURALITY OF TRANSISTORS, METHOD OF MANUFACTURING THE SAME, AND DISPLAY DEVICE

CROSS-REFERENCE TO RELATED APPLICATION

The present application is a U.S. National Phase of International Patent Application Serial No. PCT/CN2019/119707 entitled "DISPLAY PANEL, METHOD OF MANUFACTURING THE SAME, AND DISPLAY DEVICE," filed on Nov. 20, 2019. The entire contents of each of the above-referenced applications are hereby incorporated by reference for all purposes.

TECHNICAL FIELD

The present disclosure relates to the field of display technology, in particular to a display panel, a method of manufacturing a display panel and a display device.

BACKGROUND AND SUMMARY

Active-Matrix Organic Light-Emitting Diode (AMOLED) display panels are widely used in various fields due to their low power consumption, low production cost, and wide color gamut.

The AMOLED display panel includes a pixel driving circuit located in a display area and a gate driving circuit located in a non-display area. The pixel driving circuit includes a plurality of sub-pixel driving circuits arranged in an array, and the gate driving circuit includes a plurality of shift register units. Each shift register unit is used to provide a gate driving signal for a corresponding row of sub-pixel driving circuits. Since the gate driving circuit is arranged in the non-display area of the AMOLED display panel, the frame width of the AMOLED display panel is determined by the arrangement of the gate driving circuit.

The objective of the present disclosure is to provide a display substrate, a method of manufacturing the display substrate and a display device.

In a first aspect, a display substrate incudes a substrate and a gate driving circuit provided on the substrate; the gate driving circuit includes: a frame start signal line, a clock signal line, an inverted clock signal line, a first level signal line, a second level signal line, and a plurality of shift register units, wherein each of the plurality of shift register units includes a plurality of transistors, the plurality of transistors at least include a first transistor, a second transistor, and a third transistor, an active layer of the first transistor, an active layer of the second transistor and an active layer of the third transistor are formed by a continuous first semiconductor layer, the first semiconductor layer extends along a first direction; the first semiconductor layer includes at least three channel portions corresponding to the first transistor, the second transistor and the third transistor, and a conductive portion provided between adjacent channel portions, the at least three channel portions are arranged along the first direction, transistors corresponding to the adjacent channel portions are coupled to each other through a corresponding conductive portion.

Optionally, a gate electrode of the first transistor comprises: a first gate pattern, a second gate pattern, and a third gate pattern; an orthographic projection of the first gate pattern on the substrate and an orthographic projection of the second gate pattern on the substrate both partially overlap an orthographic projection of a channel portion of the first transistor on the substrate, the first gate pattern and the second gate pattern both extend along a second direction, and the second direction intersects the first direction; the third gate pattern is located at a side of the channel portion of the first transistor away from the second level signal line, and the third gate pattern is respectively connected to the first gate pattern and the second gate pattern; an end of the first gate pattern away from the third gate pattern or an end of the second gate pattern away from the third gate pattern is coupled to the clock signal line.

Optionally, a width to length ratio of a channel of the first transistor, a width to length ratio of a channel of the second transistor and a width to length ratio of a channel of the third transistor are the same.

Optionally, in the second direction, a length of the channel portion of the second transistor is the same as a length of the channel portion of the third transistor, and the length of the channel portion of the second transistor is smaller than a length of the channel portion of the first transistor; in the first direction, a width of the channel portion of the second transistor is the same as a width of the channel portion of the third transistor, and the width of the channel portion of the second transistor is smaller than a width of the channel portion of the first transistor.

Optionally, the active layer of the first transistor includes two first conductive portions arranged opposite to each other along the first direction, and a first channel portion located between the two first conductive portions; the active layer of the second transistor includes two second conductive portions arranged opposite to each other along the first direction, and a second conductive portion located between the two second conductive portions; the active layer of the third transistor includes two third conductive portions arranged opposite to each other along the first direction, and a third channel portion located between the two third conductive portions; the third channel portion is located between the first channel portion and the second channel portion, and the first conductive portion and the third conductive portion located between the first channel portion and the third channel portion are coupled to each other, and the second conductive portion and the third conductive portion located between the second channel portion and the third channel portion are coupled to each other.

Optionally, the shift register unit includes a common connection terminal; the plurality of transistors further include a fourth transistor and a fifth transistor, and an active layer of the fourth transistor and an active layer of the fifth transistor are formed by a continuous second semiconductor layer; the active layer of the fourth transistor includes two fourth conductive portions arranged opposite to each other, and a fourth channel portion located between the two fourth conductive portions; the active layer of the fifth transistor includes two fifth conductive portions arranged opposite to each other, and a fifth channel portion located between the two fifth conductive portions; one of the fourth conductive portions and one of the fifth conductive portions are coupled to form a coupling end, and the coupling end is coupled to the common connection end through a first conductive connection portion.

Optionally, the two fourth conductive portions are arranged opposite to each other along the first direction, the two fifth conductive portions are arranged opposite to each other along the second direction, and the second direction intersects the first direction; the active layer of the fourth transistor and the active layer of the fifth transistor are formed in an L shape together, and the coupling end is located at a corner of the L shape.

Optionally, the first level signal line extends along the first direction; the plurality of transistors further include a fourth transistor and a sixth transistor respectively coupled to the first level signal line, and an orthographic projection of one electrode of the fourth transistor coupled to the first level signal line on the substrate and an orthographic projection of one electrode of the sixth transistor coupled to the first level signal line on the substrate have a first overlapping area with an orthographic projection of the first level signal line on the substrate, the one electrode of the fourth transistor and the one electrode of the sixth transistor both are directly coupled to the first level signal line through a first via hole provided in the first overlapping area.

Optionally, an orthographic projection of a fourth channel portion included in the fourth transistor on the substrate, and an orthographic projection of a sixth channel portion included in the sixth transistor are both located within a same side of the orthographic projection of the first level signal line on the substrate.

Optionally, the orthographic projection of the fourth channel portion included in the fourth transistor on the substrate is located at a first side of the orthographic projection of the first level signal line on the substrate, the orthographic projection of the sixth channel portion of the sixth transistor on the substrate is located at a second side of the orthographic projection of the first level signal line on the substrate, the first side and the second side are opposite to each other.

Optionally, a first overlapping area formed by the one electrode of the fourth transistor and the first level signal line is independent from a first overlapping area formed by the one electrode of the sixth transistor and the first level signal line.

Optionally, the shift register unit includes a gate driving signal output terminal, and the plurality of transistors include a seventh transistor and an eighth transistor arranged along the first direction, an output electrode of the seventh transistor and an output electrode of the eighth transistor are both coupled to the gate driving signal output terminal; the seventh transistor is used to control the gate driving signal output terminal to output a valid level, the eighth transistor is used to control the gate driving signal output terminal to output an invalid level.

Optionally, an input electrode of the seventh transistor includes a plurality of first input electrode patterns arranged along the first direction, and a plurality of second input electrode patterns located on the same side of the plurality of first input electrode patterns and respectively connected to the plurality of first input electrode patterns; the output electrode of the seventh transistor includes a plurality of first output electrode patterns, and a plurality of second output electrode patterns located on the same side of the plurality of first output electrode patterns and respectively coupled to the plurality of first output electrode patterns, the first output electrode patterns and the first input electrode patterns are alternately arranged; a gate electrode of the seventh transistor includes a plurality of fourth gate patterns, and a plurality of fifth gate patterns located on the same side of the plurality of fourth gate patterns and respectively coupled to the plurality of fourth gate patterns, each of the plurality of fourth gate patterns is located between an adjacent first input electrode pattern and an adjacent first output electrode pattern; an orthographic projection of the gate electrode of the eighth transistor on the substrate is located between an orthographic projection of the input electrode of the eighth transistor on the substrate and the orthographic projection of the output electrode of the eighth transistor on the substrate, a first output electrode pattern of the seventh transistor closest to the gate electrode of the eighth transistor is multiplexed as the output electrode of the eighth transistor; the first input electrode pattern, the first output electrode pattern, the fourth gate pattern, the gate electrode of the eighth transistor, and the input electrode of the eighth transistor all extend along a second direction, and the second direction intersects the first direction.

Optionally, the seventh transistor includes two seventh active patterns arranged along the second direction, and each of the two seventh active patterns includes seventh conductive portions and seventh channel portions alternately arranged along the first direction; the seventh channel portions corresponds to the fourth gate patterns in one-to-one correspondence, and the orthographic projection of each seventh channel portion on the substrate is located within the orthographic projection of the corresponding fourth gate pattern on the substrate; one part of the seventh conductive portions in the seventh transistor correspond to the first input electrode patterns in one-to-one correspondence, and the orthographic projection of the first input electrode pattern on the substrate and the orthographic projection of the corresponding seventh conductive portion on the substrate have a second overlapping area, and the first input electrode pattern is coupled to the corresponding seventh conductive portion through at least one second via hole provided in the second overlap area; another part of the seventh conductive portions in the seventh transistor correspond to the first output electrode patterns in one-to-one correspondence, and the orthographic projection of the first output electrode pattern on the substrate and the orthographic projection of the corresponding seventh conductive portion on the substrate have a third overlapping area, and the first output electrode pattern is coupled to the corresponding seventh conductive portion through at least one third via hole provided in the third overlapping area; the eighth transistor includes two eighth active patterns arranged along the second direction, each of the eighth active patterns includes an eighth conductive portion and an eighth channel portion, an orthographic projection of the eighth conductive portion on the substrate and the orthographic projection of the input electrode of the eighth transistor on the substrate have a fourth overlapping area, and the eighth conductive portion is coupled to the input electrode of the eighth transistor through at least one fourth via hole provided in the fourth overlapping area; the orthographic projection of the eighth channel portion on the substrate is located within the orthographic projection of the gate electrode of the eighth transistor on the substrate; the seventh active patterns have a one-to-one correspondence with the eighth active patterns, and the corresponding seventh active pattern and the eighth active pattern are formed by a continuous third semiconductor layer.

Optionally, the clock signal line, the inverted clock signal line, and the second level signal line all extend along the first direction, and an orthographic projection of the clock signal line on the substrate, an orthographic projection of the inverted clock signal line on the substrate, and an orthographic projection of the second level signal line on the substrate are all located at a side of an orthographic projection of the shift register unit on the substrate away from a display area of the display substrate.

Optionally, the gate driving circuit further comprises a frame start signal line; the plurality of transistors further include a fourth transistor, a fifth transistor, a sixth transistor, a seventh transistor, and an eighth transistor; a gate electrode of the first transistor is coupled to the clock signal line, an input electrode of the first transistor is coupled to the frame start signal line, and an output electrode of the first transistor is coupled to a gate electrode of the fifth transistor; an input electrode of the fifth transistor is coupled to the clock signal line, and an output electrode of the fifth transistor is coupled to an output electrode of the fourth transistor; a gate electrode of the fourth transistor is coupled to the clock signal line, an input electrode of the fourth transistor is coupled to the first level signal line, and the output electrode of the fourth transistor is coupled to the gate electrode of the eighth transistor; an input electrode of the eighth transistor is coupled to the second level signal line, and an output electrode of the eighth transistor is coupled to the gate driving signal output terminal; an gate electrode of the seventh transistor is coupled to the output electrode of the sixth transistor, an input electrode of the seventh transistor is coupled to the inverted clock signal input terminal, and an output electrode of the seventh transistor is coupled to the gate driving signal output terminal; a gate electrode of the sixth transistor is coupled to the first level signal line, and an input electrode of the sixth transistor is coupled to the output electrode of the first transistor; a gate electrode of the second transistor is coupled to the output electrode of the fourth transistor, an input electrode of the second transistor is coupled to the second level signal line, and an output electrode of the second transistor is coupled to the input electrode of the third transistor; a gate electrode of the third transistor is coupled to the inverted clock signal line, and an output electrode of the third transistor is coupled to the input electrode of the sixth transistor; the shift register unit further includes: a first capacitor, a first electrode plate of the first capacitor is coupled to the gate electrode of the eighth transistor, and a second electrode plate of the first capacitor is coupled to the second level signal line; and a second capacitor, a first electrode plate of the second capacitor is coupled to the gate electrode of the seventh transistor, and a second electrode plate of the second capacitor is coupled to the gate driving signal output terminal.

Optionally, the clock signal line, the inverted clock signal line and the second level signal line are arranged in sequence along a direction close to the display area; along the first direction, the third transistor is located between the first transistor and the second transistor; the fourth transistor is located at a side of the first transistor away from the second level signal line; the fifth channel portion of the fifth transistor is located between the first channel portion of the first transistor and the fourth channel portion of the fourth transistor, and the orthographic projection of the input electrode of the fifth transistor on the substrate is located between the orthographic projection of the first channel portion of the first transistor on the substrate and the orthographic projection of the fifth channel portion of the fifth transistor on the substrate; the common connection terminal includes the gate electrode of the second transistor, the output electrode of the fifth transistor is coupled to the gate electrode of the second transistor through the first conductive connection portion, and the first conductive connection portion extends along the first direction; the first level signal line is located at a side of the fourth channel portion of the fourth transistor away from the second level signal line, and the orthographic projection of the first level signal line on the substrate is located between the orthographic projection of the fourth channel portion of the fourth transistor on the substrate and the orthographic projection of the sixth channel portion of the sixth transistor on the substrate; the eighth transistor and the seventh transistor are located at a side of the sixth transistor away from the first level signal line.

Optionally, the shift register unit further comprises a third conductive connection portion coupled to the second level signal line, and a fourth conductive connection portion for coupling the gate electrode of the eighth transistor and the gate electrode of the second transistor, the third conductive connection portion and the fourth conductive connection portion both extend along the second direction; the second electrode plate of the first capacitor extends along the second direction, and an orthographic projection of one end of the second electrode plate of the first capacitor close to the third conductive connection portion on the substrate and the orthographic projection of the third conductive connecting portion on the substrate have a fifth overlapping area, and the end of the second electrode plate of the first capacitor close to the third conductive connecting portion is coupled to the third conductive connection portion through at least one fifth via hole provided in the fifth overlapping area; an orthographic projection of one end of the second electrode plate of the first capacitor close to the input electrode of the eighth transistor on the substrate and the orthographic projection of the input electrode of the eighth transistor on the substrate have a sixth overlapping area, the end of the second electrode plate of the first capacitor close to the input electrode of the eighth transistor is coupled to the input electrode of the eighth transistor through at least one sixth via hole provided in the sixth overlapping area; an orthographic projection of the second electrode plate of the first capacitor on the substrate at least partially overlaps the orthographic projection of the fourth conductive connection portion on the substrate, and the fourth conductive connection portion is multiplexed as the first electrode plate of the first capacitor.

Optionally, the second electrode plate of the second capacitor is located at a side of the seventh channel portion of the seventh transistor away from the first level signal line; the orthographic projection of the second electrode plate of the second capacitor on the substrate and the orthographic projection of the output electrode of the seventh transistor on the substrate have a seventh overlapping area, the second electrode plate of the second capacitor is coupled to the output electrode of the seventh transistor through a seventh via hole provided in the seventh overlapping area; the gate electrode of the seventh transistor is multiplexed as the first electrode plate of the second capacitor.

Optionally, the shift register unit further includes a fifth conductive connection portion extending along the second direction; the sixth transistor includes a sixth active pattern, the sixth active pattern extends along the first direction, and the sixth active pattern includes two sixth conductive portions arranged opposite to each other along the first direction, and a sixth channel portion located between the two sixth conductive portions, the orthographic projection of the input electrode of the sixth transistor on the substrate and the orthographic projection of one of the sixth conductive portions on the substrate have an eighth overlapping area, the input electrode of the sixth transistor is coupled to one of the sixth conductive portions through an eighth via hole provided in the eighth overlapping area, and the orthographic projection of the output electrode of the sixth transistor on the substrate and the orthographic projection of the other of sixth conductive portions on the substrate have a ninth overlapping area, and the output electrode of the sixth transistor is coupled to the other of sixth conductive portions through a ninth via hole provided in the ninth overlapping area; the input electrode of the sixth transistor is respectively coupled to the output electrode of the first transistor and the gate electrode of the fifth transistor through the fifth conductive connection portion.

In a second aspect, a display substrate includes a substrate, and a gate driving circuit provided on the substrate; the gate driving circuit includes: a frame start signal line, a clock signal line, an inverted clock signal line, a first level signal line, a second level signal line, and a plurality of shift register units, the frame start signal line, the clock signal line, the inverted clock signal line, the first level signal line and the second level signal lines all extend along the first direction; each of the plurality of shift register unit includes a gate driving signal output terminal, each of the plurality of shift register units includes a plurality of transistors, and the plurality of transistors include a seventh transistor and an eighth transistor arranged along the first direction; the seventh transistor includes a seventh transistor input electrode pattern, a seventh transistor output electrode pattern, and a seventh transistor gate pattern, an orthographic projection of the seventh transistor gate pattern on the substrate is located between the orthographic projection of the input electrode pattern of the seventh transistor on the substrate and the orthographic projection of the seventh transistor output electrode pattern on the substrate, the eighth transistor includes an eighth transistor input electrode pattern and an eighth transistor output electrode pattern and an eighth transistor gate pattern, the orthographic projection of the eighth transistor gate pattern on the substrate is located between the orthographic projection of the eighth transistor input electrode pattern on the substrate and the orthographic projection of the eighth transistor output electrode pattern on the substrate, and the seventh transistor output electrode pattern is multiplexed as the eighth transistor output electrode pattern; the seventh transistor input electrode pattern, the seventh transistor output electrode pattern, the seventh transistor gate pattern, the eighth transistor input electrode pattern, and the eighth transistor gate pattern all extend along the second direction, and the second direction intersects the first direction; the seventh transistor output electrode pattern and the eighth transistor output electrode pattern are both coupled to the gate driving signal output terminal; the seventh transistor is used to control the gate driving signal output terminal to output a valid level, the eighth transistor is used to control the gate driving signal output terminal to output an invalid level.

Optionally, the seventh transistor input electrode pattern includes a plurality of first input electrode patterns arranged along the first direction, and a plurality of second input electrode patterns arranged on a same side of the plurality of first input electrode patterns and coupled to the plurality of first input electrode patterns; the seventh transistor output electrode pattern includes a plurality of first output electrode patterns, and a plurality of second output electrode patterns arranged on a same side of the plurality of first output electrode patterns and respectively coupled to the plurality of first output electrode patterns, the first output electrode patterns and the first input electrode patterns are arranged alternately; the seventh transistor gate pattern includes a plurality of fourth gate patterns, and a plurality of fifth gate patterns located on a same side of the plurality of fourth gate patterns and respectively coupled to the plurality of fourth gate patterns, each of the plurality of fourth gate patterns is located between the first input electrode pattern and the first output electrode pattern adjacent to each other; the orthographic projection of the eighth transistor gate pattern on the substrate is located between the orthographic projection of the eighth transistor input electrode pattern on the substrate and the orthographic projection of the eighth transistor output electrode pattern on the substrate, a first output electrode pattern of the seventh transistor closest to the eighth transistor gate pattern is multiplexed as the eighth transistor output electrode pattern; the first input electrode pattern, the first output electrode pattern, the fourth gate pattern, the eighth transistor gate pattern, and the eighth transistor input electrode pattern all extend along the second direction, and the second direction intersects the first direction.

Optionally, the seventh transistor includes two seventh active patterns arranged along the second direction, and each seventh active pattern includes a seventh conductive portion and a seventh channel portion alternately arranged in the first direction; the seventh channel portions correspond to the fourth gate patterns in one-to-one correspondence, and the orthographic projection of each seventh channel portion on the substrate is located within the orthographic projection of the corresponding fourth gate pattern on the substrate; one part of the seventh conductive portions of the seventh transistor correspond to the first input electrode patterns in one-to-one correspondence, and the orthographic projection of the first input electrode pattern on the substrate and the orthographic projection of the corresponding seven conductive portions on the substrate have a second overlapping area, and the first input electrode pattern is coupled to the corresponding seventh conductive portion through at least one second via hole provided in the second overlapping area; the other part of the seventh conductive portions of the seventh transistor correspond to the first output electrode patterns in one-to-one correspondence, and the orthographic projection of the first output electrode pattern on the substrate and the orthographic projection of the corresponding seventh conductive portion on the substrate have a third overlapping area, and the first output electrode pattern is coupled to the corresponding seventh conductive portion through at least one third via hole provided in the third overlapping area; the eighth transistor includes two eighth active patterns arranged along the second direction, each eighth active pattern includes an eighth conductive portion and an eighth channel portion, the orthographic projection of the eight conductive portion on the substrate and the orthographic projection of the eighth transistor input electrode pattern on the substrate have a fourth overlapping area, the eighth conductive portion is coupled to the eighth transistor input electrode pattern through at least one fourth via hole provided in the fourth overlapping area; the orthographic projection of the eighth channel portion on the substrate is located within the orthographic projection of the eighth transistor gate pattern on the substrate; the seventh active patterns correspond to the eighth active patterns in one-to-one correspondence, and the seventh active pattern and the eighth active pattern corresponding to each other are formed by a continuous third semiconductor layer.

Optionally, the plurality of transistors at least include a first transistor, a second transistor, and a third transistor, an active layer of the first transistor, an active layer of the second transistor and an active layer of the third transistor are formed by a continuous first semiconductor layer, the first semiconductor layer extends along the first direction; the first semiconductor layer includes at least three channel portions corresponding to the first transistor, the second transistor, and the third transistor, and conductive portions arranged between adjacent channel portions, the at least three channel portions are arranged along the first direction, and transistors corresponding to the adjacent channel portions are coupled to each other through the corresponding conductive portion.

Optionally, the shift register unit further includes a common connection terminal; the plurality of transistors further include a fourth transistor and a fifth transistor, an active layer of the fourth transistor and an active layer of the fifth transistor are formed by a continuous second semiconductor layer; the active layer of the fourth transistor includes two fourth conductive portions arranged opposite to each other, a the fourth channel portion arranged between the two fourth conductive portions; the active layer of the fifth transistor includes two fifth conductive portions arranged opposite to each other, and a fifth channel portion arranged between the two fifth conductive portions; one of the fourth conductive portions and one of the fifth conductive portions are coupled to form a coupling end, and the coupling end is coupled to the common connection terminal through the first conductive connecting portion.

Optionally, the two fourth conductive portions are arranged opposite to each other along the first direction, the two fifth conductive portions are arranged opposite to each other along the second direction, and the second direction intersects the first direction; the active layer of the fourth transistor and the active layer of the fifth transistor are formed together in an L shape, and the coupling end is located at the corner of the L shape.

Optionally, the gate driving circuit further includes a frame start signal line; the plurality of transistors further include a fourth transistors, a fifth transistor, a sixth transistor, a seventh transistor, and an eighth transistor; a gate electrode of the first transistor is coupled to the clock signal line, and an input electrode of the first transistor is connected to the frame start signal line, an output electrode of the first transistor is coupled to a gate electrode of the fifth transistor; an input electrode of the fifth transistor is coupled to the clock signal line, an output electrode of the fifth transistor is coupled to an output electrode of the fourth transistor; a gate electrode of the fourth transistor is coupled to the clock signal line, an input electrode of the fourth transistor is coupled to the first level signal line, and an output electrode of the fourth transistor is coupled to a gate electrode of the eighth transistor; an input electrode of the eighth transistor is coupled to the second level signal line, an output electrode of the eighth transistor is coupled to the gate driving signal output terminal; a gate electrode of the seventh transistor is coupled to an output electrode of the sixth transistor, an input electrode of the seventh transistor is coupled to the inverted clock signal input terminal, and an output electrode of the seventh transistor is coupled to the gate driving signal output terminal; a gate electrode of the sixth transistor is coupled to the first level signal line, and an input electrode of the sixth transistor is coupled to the output electrode of the first transistor; the gate electrode of the second transistor is coupled to an output electrode of the fourth transistor, and the input electrode of the second transistor is coupled to the second level signal line, the output electrode of the second transistor is coupled to the input electrode of the third transistor; the gate electrode of the third transistor is coupled to the inverted clock signal line, the output electrode of the third transistor is coupled to an input electrode of the sixth transistor; the shift register unit further includes: a first capacitor, a first electrode plate of the first capacitor is coupled to the gate electrode of the eighth transistor, and a second electrode plate of the first capacitor is coupled to the second level signal line; and a second capacitor, a first electrode plate of the second capacitor is coupled to the gate electrode of the seventh transistor, and a second electrode plate of the second capacitor is coupled to the gate driving signal output terminal.

Optionally, along a direction close to the display area, the clock signal line, the inverted clock signal line, and the second level signal line are arranged in sequence; along the first direction, the third transistor is located between the first transistor and the second transistor; the fourth transistor is located a side of the first transistor away from the second level signal line; the fifth channel portion of the fifth transistor is located between the first channel portion of the first transistor and the fourth channel portion of the fourth transistor, and the orthographic projection of the input electrode of the fifth transistor on the substrate is arranged between the orthographic projection of the first channel portion of the first transistor on the substrate and the orthographic projection of the fifth channel portion of the fifth transistor on the substrate; the common connection terminal includes the gate electrode of the second transistor, and the output electrode of the fifth transistor is coupled to the gate electrode of the second transistor through the first conductive connection portion, The first conductive connection portion extends along the first direction; the first level signal line is located on a side of the fourth channel portion of the fourth transistor away from the second level signal line, and the orthographic projection of the first level signal line on the substrate is located between the orthographic projection of the fourth channel portion of the fourth transistor on the substrate and the orthographic projection of the sixth channel portion of the sixth transistor on the substrate; the eighth transistor and the seventh transistor are located on a side of the sixth transistor away from the first level signal line.

Optionally, the shift register unit further includes a third conductive connection portion coupled to the second level signal line, and a fourth conductive connection portion for coupling the gate electrode of the eighth transistor and the gate electrode of the second transistor, the third conductive connection portion and the fourth conductive connection portion both extend along the second direction; the second electrode plate of the first capacitor extends along the second direction, and an orthographic projection of one end of the second electrode plate of the first capacitor close to the third conductive connection portion on the substrate and an orthographic projection of the third conductive connection portion on the substrate have a fifth overlapping area, and the end of the second electrode plate of the first capacitor close to the third conductive connection portion is coupled to the third conductive connection portion through at least one fifth via hole provided in the fifth overlapping area; an orthographic projection of one end of the second electrode plate of the first capacitor close to the input electrode of the eighth transistor on the substrate, and an orthographic projection of the input electrode of the eighth transistor on the substrate have a sixth overlapping area, and the end of the second electrode plate of the first capacitor close to the input electrode of the eighth transistor is coupled to the input electrode of the eighth transistor through at least one sixth via hole provided in the sixth overlapping area; the orthographic projection of the second electrode plate of the first capacitor on the substrate at least partially overlaps the orthographic projection of the fourth conductive connecting portion on the substrate, and the fourth conductive connection portion is multiplexed as the first electrode plate of the first capacitor.

Optionally, the second electrode plate of the second capacitor is located at a side of the seventh channel portion of the seventh transistor away from the first level signal line; the orthographic projection of the second electrode plate of the second capacitor on the substrate and the orthographic projection of the output electrode of the seventh transistor on the substrate have a seventh overlapping area, the second electrode plate of the second capacitor is coupled to the output electrode of the seventh transistor through a seventh via hole provided in the seventh overlapping area; the gate electrode of the seventh transistor is multiplexed as the first electrode plate of the second capacitor.

Optionally, the shift register unit further includes a fifth conductive connection portion extending along the second direction; the sixth transistor includes a sixth active pattern, the sixth active pattern extends along the first direction, and the sixth active pattern includes two sixth conductive portions disposed opposite to each other along the first direction, and a sixth channel portion between the two sixth conductive portions, the orthographic projection of the input electrode of the sixth transistor on the substrate and the orthographic projection of the sixth conductive portion on the substrate have an eighth overlapping area, the input electrode of the sixth transistor is coupled to one of the sixth conductive portions through an eighth via hole provided in the eighth overlapping area, and the orthographic projection of the output electrode of the sixth transistor on the substrate and the orthographic projection of the other sixth conductive portion on the substrate have a ninth overlapping area, and the output electrode of the sixth transistor is coupled to the other sixth conductive portion through a ninth via hole provided in the ninth overlapping area; the input electrode of the sixth transistor is respectively coupled to the output electrode of the first transistor and the gate electrode of the fifth transistor through the fifth conductive connection portion.

In a third aspect, a display device includes the above display substrate.

In a fourth aspect, a method of manufacturing a display substrate includes manufacturing a gate driving circuit on a substrate, the gate driving circuit includes a frame start signal line, a clock signal line, and an inverted clock signal line, a first level signal line, a second level signal line, and a plurality of shift register units; each of the plurality of shift register units includes a plurality of transistors, and the plurality of transistors at least includes a first transistor, a second transistor, and a third transistor, the step of forming the first transistor, the second transistor, and the third transistor includes: forming a continuous first semiconductor material layer extending along a first direction; forming a gate insulating layer on a side of the first semiconductor material layer away from the substrate, and the gate insulating layer covering three channel regions in the first semiconductor material layer arranged along a first direction, and exposing other regions of the first semiconductor material layer other than the three channel regions, the three channel regions corresponding to a channel portion of the first transistor and a channel portion of the second transistor and a channel portion of the third transistor in one-to-one correspondence; doping the first semiconductor material layer located in the other regions by using the gate insulating layer as a mask, so that the first semiconductor material layer located in the other regions has conductivity, so as to form conductive portions between adjacent channel portions, transistors corresponding to the adjacent channel portions are coupled to each other through the corresponding conductive portions.

BRIEF DESCRIPTION OF THE DRAWINGS

The drawings described here are used to provide a further understanding of the present disclosure and constitute a portion of the present disclosure. The embodiments of the present disclosure are used for illustration, and do not limit the present disclosure.

DETAILED DESCRIPTION

In order to further illustrate the display substrate, its manufacturing method, and the display device provided by the embodiments of the present disclosure, a detailed description will be given below in conjunction with the accompanying drawings of the specification.

Figure 1:
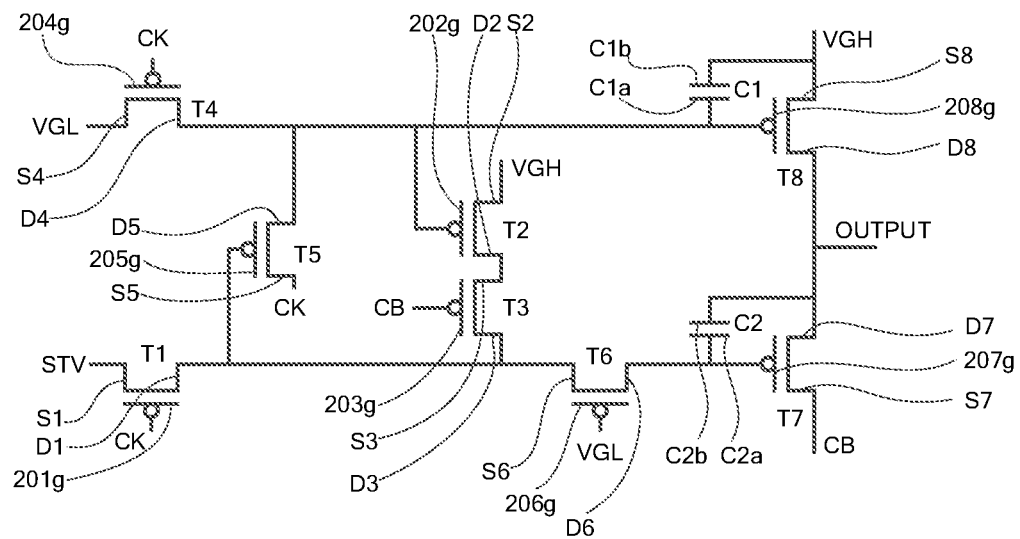
FIG. 1 is a schematic structural diagram of a shift register unit provided by an embodiment of the disclosure.
Figure 2:
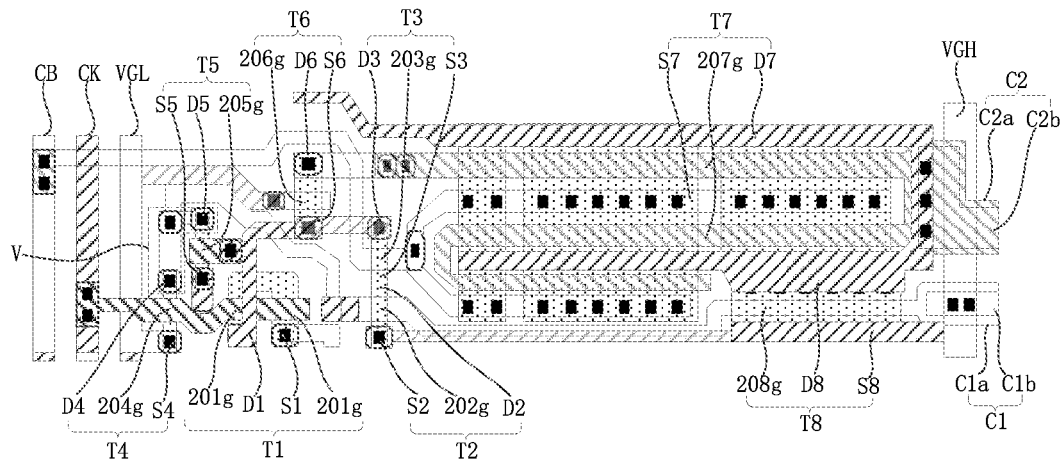
FIG. 2 is a schematic diagram of a layout of a shift register unit provided by an embodiment of the disclosure.

As shown in FIGS. 1 and 2, the present disclosure provides a display substrate. The display substrate includes a gate driving circuit located at an edge area of the display substrate. The gate driving circuit includes a frame start signal line STV, a first level signal line VGL, a second level signal line VGH, a clock signal line CK, an inverted clock signal line CB, and a plurality of shift register units. As shown in FIG. 1, the shift register unit includes: a first transistor T1, a second transistor T2, a third transistor T3, a fourth transistor T4, a fifth transistor T5, a sixth transistor T6, a seventh transistor T7, an eighth transistor T8, a first capacitor C1, a second capacitor C2 and a gate driving signal output terminal OUTPUT. Transistors included in the shift register unit are P-type transistors.

A gate electrode $201g$ of the first transistor T1 is coupled to the clock signal line CK, an input electrode S1 of the first transistor T1 is coupled to the frame start signal line STV, and an output electrode D1 of the first transistor T1 is coupled to a gate electrode $205g$ of the fifth transistor T5. An input electrode S5 of the fifth transistor T5 is coupled to the clock signal line CK, and an output electrode D5 of the fifth transistor T5 is coupled to an output electrode D4 of the fourth transistor T4. The gate electrode $204g$ of the fourth transistor T4 is coupled to the clock signal line CK, and an input electrode S4 of the fourth transistor T4 is coupled to the first level signal line VGL. A gate electrode $208g$ of the eighth transistor T8 is coupled to the output electrode D4 of the fourth transistor T4, an input electrode S8 of the eighth transistor T8 is coupled to the second level signal line VGH, and the output electrode D8 of the eight transistor T8 is coupled to the gate driving signal output terminal OUTPUT. A gate electrode $206g$ of the sixth transistor T6 is coupled to the first level signal line VGL, an input electrode S6 of the sixth transistor T6 is coupled to the output electrode D1 of the first transistor T1, and an output electrode D6 of the six transistor T6 is coupled to a gate electrode $207g$ of the seventh transistor T7. An input electrode S7 of the seventh transistor T7 is coupled to the inverted clock signal line CB, and an output electrode D7 of the seventh transistor T7 is coupled to the gate driving signal output terminal OUTPUT. A gate electrode $202g$ of the second transistor T2 is coupled to an output electrode D4 of the fourth transistor T4, an input electrode S2 of the second transistor T2 is coupled to the second level signal line VGH, and an output electrode D2 of the second transistor T2 is coupled to an input electrode S3 of the third transistor T3. A gate electrode $203g$ of the third transistor T3 is coupled to the inverted clock signal line CB, and an output electrode D3 of the third transistor T3 is coupled to the input electrode S6 of the sixth transistor T6. A first electrode plate C1a of the first capacitor C1 is coupled to a gate electrode 208g of the eighth transistor T8, and a second electrode plate C1b of the first capacitor C1 is coupled to an input electrode S8 of the eighth transistor T8. A first electrode plate C2a of the second capacitor C2 is coupled to the gate electrode 207g of the seventh transistor T7, and a second plate C2b of the second capacitor C2 is coupled to the output electrode D7 of the seventh transistor T7.

As shown in FIG. 2, when the gate driving circuit with the above structure is laid out in the edge area of the display substrate, the clock signal line CK, the inverted clock signal line CB and the first level signal line VGL are arranged at a first edge of the edge area away from the display area, the second level signal line VGH is arranged at an second edge of the edge area close to the display area, and the shift register units included in the gate driving circuit are arranged in an area between the first edge and the second edge.

In more detail, along a second direction close to the display area of the display substrate, the clock signal line CK, the inverted clock signal line CB, the first level signal line VGL, and the second level signal line VGH are arranged in sequence, and the inverted clock signal line CB, the first level signal line VGL, and the second level signal line VGH all extend in a first direction perpendicular to the second direction.

The fourth transistor T4, the fifth transistor T5, the first transistor T1, and the sixth transistor T6 in the shift register unit are sequentially arranged along the second direction, and the second transistor T2 and the third transistor T3 are arranged along the first direction, the eighth transistor T8 and the seventh transistor T7 are arranged along the first direction, and the eighth transistor T8 and the seventh transistor T7 are located between the sixth transistor T6 and the display area of the display substrate, the second transistor T2 and the third transistor T3 are located between the sixth transistor T6 and the seventh transistor T7. An active pattern of the first transistor T1 is arranged in a U-shaped structure, so that the first transistor T1 is in a double gate structure.

In the above-mentioned layout of the gate driving circuit, since most of the transistors included in the shift register unit are arranged in sequence along the second direction, and the fifth transistor T5 is connected to the fourth transistor T4 through a plurality of via holes (three via holes circled in a V portion in FIG. 2 and the black rectangles in FIG. 2 represent the via holes), and the eighth transistor T8 and the seventh transistor T7 have a longer size in the second direction, so it is not conducive to the narrow frame of the display substrate.

Based on the above problems, the layout of the transistors in the shift register unit can be adjusted to reduce the area occupied by the shift register unit, and further reduce a width of the frame of the display substrate.

Figure 3:
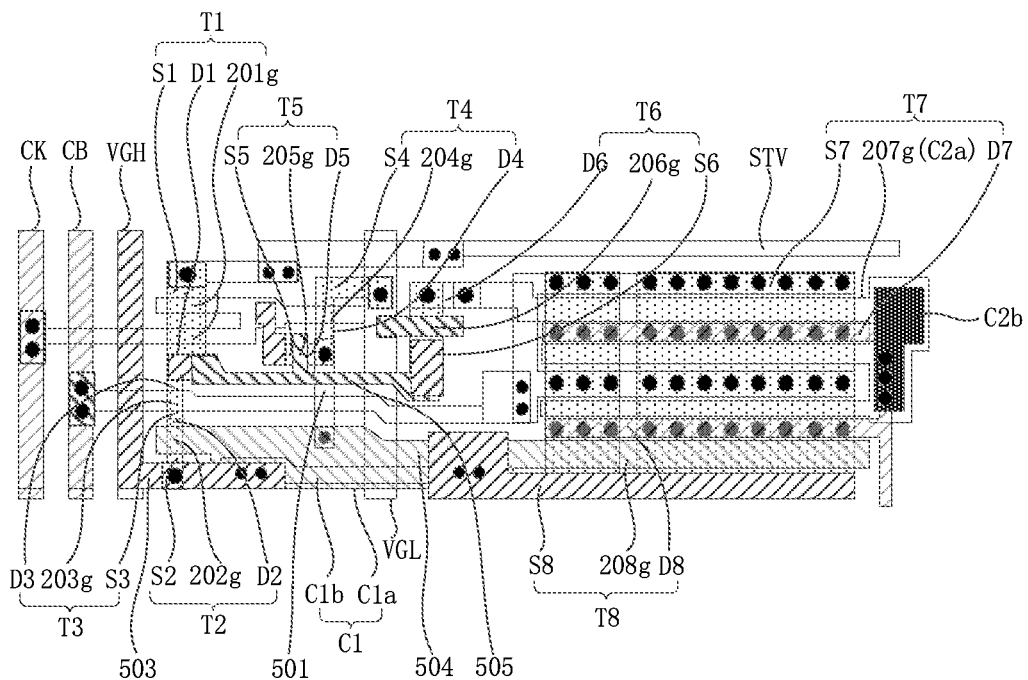
FIG. 3 is a schematic diagram of another layout of a shift register unit provided by an embodiment of the disclosure.
Figure 4:
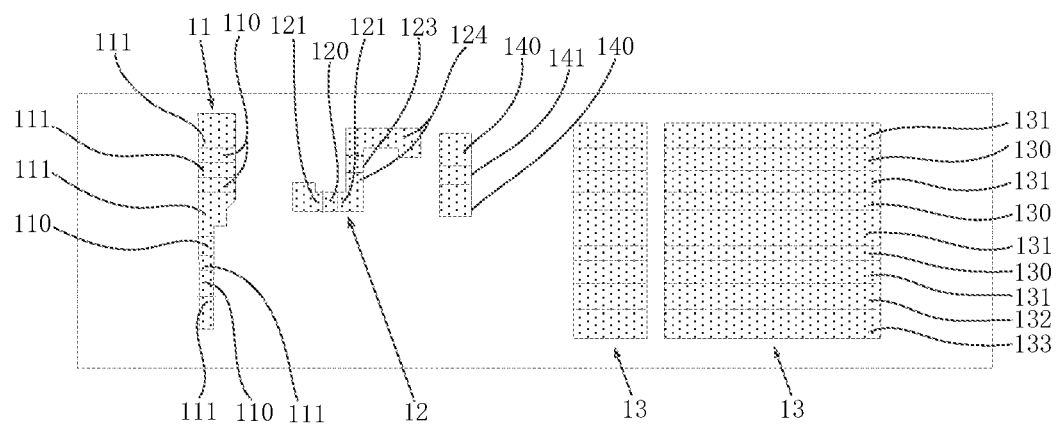
FIG. 4, FIG. 5, FIG. 6, and FIG. 7 are schematic diagrams of film layers in the shift register unit provided by an embodiments of the present disclosure.

As shown in FIGS. 3 and 4, an embodiment of the present disclosure provides a display substrate, including: a substrate, and a gate driving circuit provided on the substrate; the gate driving circuit includes: a frame start signal line STV, a clock signal line CK, an inverted clock signal line CB, a first level signal line VGL, a second level signal line VGH, and a plurality of shift register units, each of which includes a plurality of transistors, the plurality of transistors at least include a first transistor T1, a second transistor T2, and a third transistor T3, an active layer of the first transistor T1, an active layer of the second transistor T2, and an active layer of the third transistor T3 are formed by a continuous first semiconductor layer 11, the first semiconductor layer 11 extends along the first direction; the first semiconductor layer 11 includes at least three channel portions (110 in FIG. 4) corresponding to the first transistor T1, the second transistor corresponding to T2 and the third transistor T3, and conductive portions (111 in FIG. 4) arranged between adjacent channel portions, the at least three channel portions are arranged along the first direction, and the transistors corresponding to the adjacent channel portions are coupled to each other through the corresponding conductive portions.

Specifically, the active layer of the first transistor T1, the active layer of the second transistor T2, and the active layer of the third transistor T3 are formed by a continuous first semiconductor layer 11, and overlapping areas between the orthographic projection of the first semiconductor layer 11 on the substrate and the orthographic projection of the gate electrode 201g of the first transistor T1, the gate electrode 202g of the second transistor T2, and the gate electrode 203g of the third transistor T3 on the substrate are used as the at least three channel portions corresponding to the first transistor T1, the second transistor T2, and the third transistor T3 (110 in FIG. 4). In the first semiconductor layer 11, portions between the adjacent channel portions are conductive portions (111 in FIG. 4), and the transistors corresponding to the adjacent channel portions are coupled to each other through the corresponding conductive portions.

In the first transistor T1, the second transistor T2, and the third transistor T3, the conductive portions located on both sides of the channel portion of each transistor can respectively serve as the input electrode and the output electrode of the transistor, so that in the first transistor T1, the second transistor T2, and the third transistor T3, adjacent transistors can reuse the same conductive portion as the input electrode or output electrode thereof, and the adjacent transistors can be electrically coupled to each other through the conductive portion between the channel portions of the adjacent transistors.

It is worth noting that when forming the first semiconductor layer 11, for example, the first semiconductor material layer may be formed first, and then the gate electrode 201g of the first transistor T1, the gate electrode 202g of the second transistor T2 and the gate electrode 203g of the third transistor T3 are formed. The gate electrode 201g of the first transistor T1, the gate electrode 202g of the second transistor T2, and the gate electrode 203g of the third transistor T3 are used as masks, and a portion of the first semiconductor material layer that is not covered by the gate electrode of each transistor is doped, so that the portion of the first semiconductor material layer that is not covered by the gate electrode of each transistor is formed as the conductive portion, and the portion of the first semiconductor material layer that is covered by the gate electrode of each transistor is formed as the channel portion.

When the first transistor T1, the second transistor T2, and the third transistor T3 are in operation, the signals can be transmitted to the first transistor T1, the second transistor T2, and the third transistor T3 sequentially, or, when the first transistor T1, the third transistor T3, and the second transistor T2 are coupled in sequence, a coupled node between the first transistor T1 and the third transistor T3 is used as a common output terminal, so that the signal transmitted by the first transistor T1 and the signals transmitted by the third transistor T3 and the second transistor T2 can be outputted from the common output terminal.

According to the specific structure of the above display substrate, in the display substrate provided by the embodiment of the present disclosure, the first transistor T1, the second transistor T2, and the third transistor T3 in the shift register unit can be arranged along the first direction, thereby reducing the area occupied by the shift register unit in the second direction. Moreover, in the first transistor T1, the second transistor T2, and the third transistor T3, the adjacent transistors can be directly coupled through the conductive portion included in the first semiconductor layer 11, which reduces the area occupied by the first transistor T1, the second transistor T2, and the third transistor T3 in the first direction. Therefore, in the display substrate provided by the embodiments of the present disclosure, the shift register unit included in the display substrate can occupy a smaller area in both the first direction and the second direction, thereby meeting the development needs of the narrow frame of the display substrate.

Figure 5:
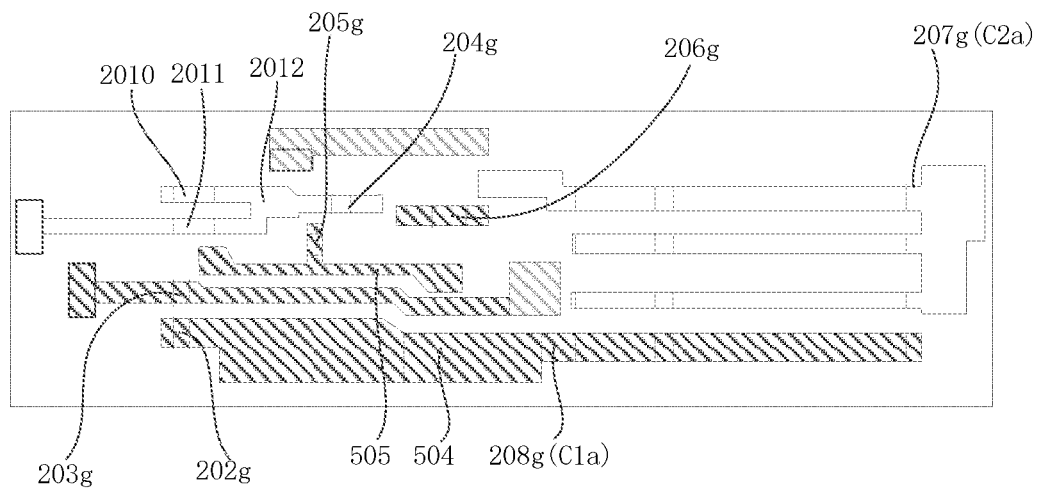

As shown in FIGS. 3 and 5, in some embodiments, the gate electrode 201g of the first transistor T1 includes: a first gate pattern 2010, a second gate pattern 2011, and a third gate pattern 2012. The orthographic projection of the first gate pattern 2010 on the substrate and the orthographic projection of the second gate pattern 2011 on the substrate both partially overlap the orthographic projection of the channel portion of the first transistor T1 on the substrate. The first gate pattern 2010 and the second gate pattern 2011 both extend along the second direction, and the second direction intersects the first direction.

The third gate pattern 2012 is located on a side of the channel portion of the first transistor T1 away from the second level signal line VGH, and the third gate pattern 2012 is respectively connected to the first gate pattern 2010 and the second gate pattern 2011.

An end of the first gate pattern 2010 away from the third gate pattern 2012 or an end of the second gate pattern 2011 away from the third gate pattern 2012 is coupled to the clock signal line CK.

Specifically, the first transistor T1 is set to the above-mentioned structure, so that the first transistor T1 has a double-gate structure, the gate electrode 201g of the first transistor T1 is respectively coupled to the clock signal line CK and the gate electrode 205g of the fifth transistor T5 under the condition that the first transistor T1 occupies a small space.

It should be noted that the angle between the second direction and the first direction can be set according to actual needs. For example, the second direction is perpendicular to the first direction.

In some embodiments, the width to length ratio of the channel of the first transistor T1, the width to length ratio of the channel of the second transistor T2 and the width to length ratio of the channel of the third transistor T3 are the same.

Specifically, the sizes of the channel portions of the first transistor T1, the second transistor T2, and the third transistor T3 can be set according to actual needs. For example, the width to length ratio of the channel of the first transistor T1, the width to length ratio of the channel of the second transistor T2 and the width to length ratio of the channel of the third transistor T3 are set to the same. This arrangement makes the first transistor T1, the second transistor T2 and the third transistor T3 have the same driving performance, which is more conducive to the stability of the shift register unit.

Further, the width to length ratio of the channel of the first transistor T1, the width to length ratio of the channel of the second transistor T2 and the width to length ratio of the channel of the third transistor T3 are set the same in various ways. For example, in the second direction, the length of the channel portion of the second transistor T2 is set to be the same as the length of the channel portion of the third transistor T3, and the length of the channel portion of the second transistor T2 is less than the length of the channel portion of the first transistor T1; in the first direction, the width of the channel portion of the second transistor T2 is the same as the width of the channel portion of the third transistor T3, and the width of the channel portion of the second transistor T2 is smaller than the width of the channel portion of the first transistor T1.

In some embodiments, the active layer of the first transistor T1 includes two first conductive portions arranged opposite to each other along the first direction, and a first channel located between the two first conductive portions. The active layer of the second transistor T2 includes two second conductive portions arranged opposite to each other along the first direction, and a second channel portion located between the two second conductive portions. The active layer of the third transistor T3 includes two third conductive portions arranged opposite to each other along the first direction, and a third channel portion located between the two third conductive portions. The third channel portion is located between the first channel portion and the second channel portion, and the first conductive portion located between the first channel portion and the third channel portion is coupled to and the third channel portion; the second conductive portion located between the second channel portion and the third channel portion is coupled to the third conductive portion.

Specifically, the specific structures of the active layer of the first transistor T1, the active layer of the second transistor T2, and the active layer of the third transistor T3 are various. For example, in the first direction, the first transistor T1, the third transistor T3, and the second transistor T2 are arranged in sequence. The active layer of each of the first transistor T1, the third transistor T3, and the second transistor T2 includes two conductive portions arranged opposite to each other along the first direction, and a channel portion between the two conductive portions. This structure makes the first transistor T1, the third transistor T3 and the second transistor T2 occupy the smallest space in the second direction, thereby further reducing the size of the shift register unit in the second direction.

As shown in FIGS. 3 and 4, in some embodiments, the shift register unit further includes a common connection terminal; the plurality of transistors further include a fourth transistor T4 and a fifth transistor T5. The active layer of the fourth transistor T4 and the active layer of the fifth transistor T5 are formed by a continuous second semiconductor layer 12; the active layer of the fourth transistor T4 includes two fourth conductive portions 124 arranged opposite to each other, and the fourth channel portion 123 between the two fourth conductive portions 124. The active layer of the fifth transistor T5 includes two fifth conductive portions 121 arranged opposite to each other, and the fifth channel portion 120 between the two fifth conductive portions 121; one of the fourth conductive portions 124 and one of the fifth conductive portions 121 are coupled to form a coupling end, and the coupling end is coupled to the common connection terminal through the first conductive connecting portion 501.

Specifically, the shift register unit further includes a fourth transistor T4 and a fifth transistor T5 coupled to the common connection terminal, and the active layer of the fourth transistor T4 and the active layer of the fifth transistor T5 may be formed by a continuous second semiconductor layer 12, an overlapping area between the orthographic projection of the second semiconductor layer 12 on the substrate and the orthographic projection of the gate electrode 204g of the fourth transistor T4 on the substrate is used as the fourth channel portion 123 of the fourth transistor T4, an overlapping area between the orthographic projection of the second semiconductor layer 12 on the substrate and the orthographic projection of the gate electrode 205g of the fifth transistor T5 on the substrate is used as the fifth channel portion 120 of the fifth transistor T5; an overlapping area between the orthographic projection of the second semiconductor layer 12 on the substrate and the orthographic projection of the input electrode S4 and the output electrode D4 of the fourth transistor T4 on the substrate is used as the fourth conductive portion 124 of the fourth transistor T4, and an overlapping area between the orthographic projections of the second semiconductor layer 12 on the substrate and the orthographic projection of the input electrode S5 and the output electrode D5 of the fifth transistor T5 on the substrate is used as the fifth conductive portion 121 of the fifth transistor T5.

It is worth noting that of the two fourth conductive portions 124 are included in the fourth transistor T4, one of the fourth conductive portions 124 can be used as the input electrode S4 of the fourth transistor T4, and the other of fourth conductive portion 124 can be used as the output electrode D4 of the fourth transistor T4. Two fifth conductive portions 121 are included in the fifth transistor T5, one of the fifth conductive portions 121 can be used as the input electrode S5 of the fifth transistor T5, and the other of the five conductive portion 121 can be used as the output electrode D5 of the fifth transistor T5.

The fourth channel portion 123 and the fourth conductive portion 124 of the fourth transistor T4, and the fifth channel portion 120 and the fifth conductive portion of the fifth transistor T5 are formed by one second semiconductor layer 12, so that the fourth channel portion 123 and the fourth conductive portion 124 of the fourth transistor T4, and the fifth channel portion 120 and the fifth conductive portion 121 of the fifth transistor T5 can be formed at the same time by one patterning process and one doping process. Moreover, one fourth conductive portion 124 and one fifth conductive portion 121 are coupled to form the coupling end, so that the fourth conductive portion 124 and the fifth conductive portion 121 can be reused as the same conductive portion, thereby effectively reducing the layout space occupied by the fourth transistor T4 and the fifth transistor T5. In addition, the fourth transistor T4 and the fifth transistor T5 of the above-mentioned structure enable the coupling end is coupled to the common connection end through only one first conductive connection portion 501, so that the fourth transistor T4 and the fifth transistor T5 are coupled to the common connection terminal at the same time, thereby avoiding providing a dedicated conductive connection portion for each transistor that needs to be coupled to the common connection terminal, thereby further reducing the overall layout space of the shift register unit.

As shown in FIG. 4, in some embodiments, the two fourth conductive portions 124 are arranged opposite to each other along the first direction, the two fifth conductive portions 121 are arranged opposite to each other along the second direction, and the second direction intersects the first direction; the active layer of the fourth transistor T4 and the active layer of the fifth transistor T5 are formed together in an L shape, and the coupling end is located at the corner of the L shape.

Specifically, the specific layout of the fourth transistor T4 and the fifth transistor T5 can be set according to actual needs. For example, the second semiconductor layer 12 is formed into an L shape, and one side of the L shape extends along the first direction to form the two fifth conductive portions 121 and the fifth channel portion 120, and the other side of the L shape extends along the second direction to form the two fourth conductive portions 124 and the fourth channel portion 123. In the fourth transistor T4 and the fifth transistor T5, the fifth conductive portion 121 and the fourth conductive portion 124 for forming the coupling end may be located at corner of the L-shape.

In the foregoing, the active layer of the fourth transistor T4 and the active layer of the fifth transistor T5 are formed into an L shape together, so that the coupling end is located at the corner of the L shape, which is more conducive to reduce the distance between the coupling end and the common connection end, and reduce the layout space of the first conductive connection portion, so that the display substrate is more in line with the development demand of narrow frame.

As shown in FIG. 3, in some embodiments, the first level signal line VGL extends along the first direction; the plurality of transistors further include the fourth transistor and the sixth transistor coupled to the first level signal line, an orthographic projection of one electrode of the fourth transistor coupled to the first level signal line VGL on the substrate, and an orthographic projection of one electrode of the sixth transistor coupled to the first level signal line VGL on the substrate each has a first overlapping area with the orthographic projection of the first level signal line VGL on the substrate. One electrode of the fourth transistor and one electrode of the six transistors are directly coupled to the first level signal line VGL through a first via hole provided in the first overlapping area.

Specifically, the shift register unit further includes a fourth transistor and a sixth transistor respectively coupled to the first level signal line VGL, and the fourth transistor and the sixth transistor may both be provided in the vicinity of the first level signal line VGL, an orthographic projection of one electrode of the fourth transistor coupled to the first level signal line VGL on the substrate and an orthographic projection of one electrode of the sixth transistor coupled to the first level signal line VGL on the substrate each has a first overlapping area with the orthographic projection of the first level signal line VGL on the substrate. When the one electrode of the fourth transistor and the one electrode of the sixth transistor coupled to the first-level signal line VGL are arranged in different layers from the first-level signal line VGL, the one electrode of the fourth transistor and the one electrode of the sixth transistor can be directly coupled to the first level signal line VGL through a first via hole arranged in an overlapping area.

The coupling the fourth transistor and the sixth transistor to the first level signal line VGL avoids the addition of a dedicated conductive connection portion for coupling the first level signal line VGL and the sixth transistor, thereby reducing the area of the display substrate occupied by the shift register unit.

In some embodiments, an orthographic projection of the fourth channel portion of the fourth transistor on the substrate and an orthographic projection of the sixth channel portion of the sixth transistor on the substrate may be arranged at the same side of the orthographic projection of the first level signal line VGL on the substrate.

Specifically, when the layout of the shift register unit is actually performed, the orthographic projection of the fourth channel portion included in the fourth transistor on the substrate and the orthographic projection of the sixth channel portion included in the sixth transistor can be set to be arranged on the same side of the orthographic projection of the first level signal line VGL on the substrate according to actual needs, that is, the fourth transistor and the sixth transistor are both located on the same side of the first level signal line VGL; in this case, the fourth transistor and the sixth transistor can also be arranged in sequence along the first direction at the same time, so as to minimize the area of the display substrate occupied by the four transistors, the sixth transistor and the first level signal line VGL.

In some embodiments, an orthographic projection of the fourth channel portion included in the fourth transistor on the substrate may be arranged at the first side of the orthographic projection of the first level signal line VGL on the substrate, the orthographic projection of the sixth channel portion included in the sixth transistor on the substrate is arranged at the second side of the orthographic projection of the first level signal line VGL on the substrate. The first side is opposite to the second side.

Specifically, as shown in FIG. 3, when the layout of the shift register unit is actually performed, the orthographic projection of the fourth channel portion included in the fourth transistor T4 on the substrate can be set to be located at the first side of the orthographic projection of the first level signal line VGL on the substrate, and the orthographic projection of the sixth channel portion included in the sixth transistor T6 on the substrate is located at the second side of the orthographic projection of the first level signal line VGL on the substrate, that is, the fourth transistor T4 and the sixth transistor T6 are respectively located on opposite sides of the first level signal line VGL. This arrangement is more conductive for the fourth transistor T4 to be coupled with other functional patterns on the first side, and for the sixth transistor T6 to be coupled with other functional patterns on the second side.

In some embodiments, a first overlapping area formed by one electrode of the fourth transistor and the first level signal line may be set to be independent from a first overlapping area formed by one electrode of the sixth transistor and the first level signal line VGL.

Specifically, when laying out the fourth transistor and the sixth transistor, the first overlapping area formed by one electrode of the fourth transistor and the first-level signal line can be set to be independent from the first overlapping area formed by one electrode of the sixth transistor and the first level signal line VGL, or alternatively, the first overlapping area formed by one electrode of the fourth transistor and the first level signal line may also be set to be independent from the first overlapping area formed by one electrode of the sixth transistor and the first level signal line VGL.

As shown in FIGS. 1 and 3, in some embodiments, the shift register unit includes a gate driving signal output terminal OUTPUT, and the plurality of transistors includes a seventh transistor T7 and an eighth transistor T8 arranged along the first direction, the output electrode D7 of the seventh transistor T7 and the output electrode D8 of the eighth transistor T8 are both coupled to the gate driving signal output terminal OUTPUT; the seventh transistor T7 is used to control the gate driving signal output terminal OUTPUT to output a valid level, and the eighth transistor T8 is used to control the gate driving signal output terminal OUTPUT to output an invalid level.

Specifically, the display area of the display substrate includes a plurality of gate lines and a plurality of data lines, and a plurality of sub-pixels defined by the plurality of gate lines and the plurality of data lines; the plurality of shift register units included in the gate driving circuit correspond to the plurality of gate lines in one-to-one correspondence, and the gate driving signal output terminal of each shift register unit is coupled to the corresponding gate line for providing a gate driving signal for the corresponding gate line.

The shift register unit further includes a seventh transistor T7 and an eighth transistor T8 arranged along the first direction. The output electrode D7 of the seventh transistor T7 and the output electrode of the eighth transistor T8 are both coupled to the gate driving signal output terminal OUTPUT, the input electrode S7 of the seventh transistor T7 is coupled to the inverted clock signal line CB, and the input electrode S8 of the eighth transistor T8 is coupled to the second level signal line VGH, the gate driving signal output terminal can be controlled by the seventh transistor T7 to output a valid level, and the gate driving signal output terminal can be controlled by the eighth transistor T8 to output an invalid level.

In the display substrate provided by the foregoing embodiment, the seventh transistor T7 and the eighth transistor T8 included in the shift register unit are arranged along the first direction, so that the seventh transistor T7 and the eighth transistor T8 occupies a small space in the second direction, which is beneficial to reduce the frame width of the display substrate.

Figure 7:
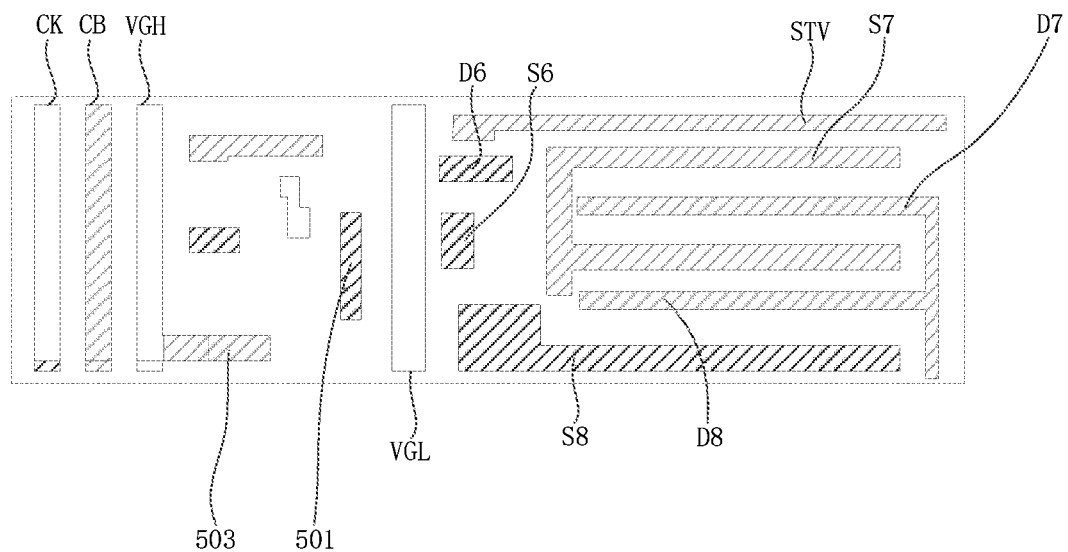

As shown in FIG. 3, FIG. 5 and FIG. 7, in some embodiments, the input electrode S7 of the seventh transistor T7 includes a plurality of first input electrode patterns arranged along the first direction, and second input electrode patterns arranged on the same side of the first input electrode patterns and respectively coupled to the plurality of first input electrode patterns. The output electrode D7 of the seventh transistor T7 includes a plurality of first output electrode patterns, and second output electrode patterns located on the same side of the plurality of first output electrode patterns and respectively coupled to the plurality of first output electrode patterns, the first output electrode pattern and the first input electrode patterns are arranged alternately. The gate electrode 207*g* of the seventh transistor T7 includes a plurality of fourth gate patterns, and fifth gate patterns located on the same side of the plurality of fourth gate patterns, and respectively coupled to the plurality of fourth gate patterns, each of the fourth gate patterns is located between the first input electrode pattern and the first output electrode pattern adjacent to each other.

The orthographic projection of the gate electrode 208*g* of the eighth transistor T8 on the substrate is arranged between the orthographic projection of the input electrode S8 of the eighth transistor T8 on the substrate and the orthographic projection of the output electrode D8 of the eighth transistor T8 on the substrate, a first output electrode pattern of the seventh transistor T7 closest to the gate electrode 208*g* of the eighth transistor T8 is multiplexed as the output electrode D8 of the eighth transistor T8.

The first input electrode pattern, the first output electrode pattern, the fourth gate pattern, the gate electrode of the eighth transistor, and the input electrode of the eighth transistor all extend along a second direction, and the second direction intersects the first direction.

Specifically, the specific numbers of the first input electrode patterns, the first output electrode patterns, and the fourth gate patterns can be set according to actual needs. For example, as shown in FIG. 7, there are two first input electrode patterns, two first output electrode patterns, three fourth gate patterns. In addition, the layout positions of the second input electrode pattern, the second output electrode pattern, and the fifth gate pattern can be set according to actual needs. For example, the second input electrode pattern is located on a side of the first input electrode pattern away from the display area of the display substrate, and the second output electrode pattern is located on a side of the first output electrode pattern close to the display area, and the fifth gate pattern is located on a side of the fourth gate pattern close to the display area; this layout is more convenient for the second input electrode pattern to be coupled to other functional patterns in the shift register unit on the side of the first input electrode pattern away from the display area of the display substrate, which is more convenient for the second output electrode pattern to be coupled to the gate driving signal output terminal OUTPUT in the shift register unit.

In addition, the seventh transistor T7 with the above structure has better driving performance and can be turned on and off quickly.

Since the output electrode D8 of the eighth transistor T8 and the output electrode D7 of the seventh transistor T7 are both coupled to the gate driving signal output terminal OUTPUT, when the eighth transistor T8 is laid out, the first output electrode pattern of the seventh transistor T7 closest to the gate electrode 208g of the eighth transistor T8 is multiplexed as the output electrode D8 of the eighth transistor T8, which can further reduce the layout space of the seventh transistor T7 and the eighth transistor T8, which is beneficial to realize a narrow frame of the display substrate.

As shown in FIGS. 3 and 4, in some embodiments, the seventh transistor T7 includes two seventh active patterns arranged along the second direction, and each of the seventh active patterns includes a seventh conductive portion 131 and a seventh channel portion 130 alternately arranged in the first direction.

The seventh channel portion 130 corresponds to the fourth gate pattern in one-to-one correspondence, and the orthographic projection of each seventh channel portion 130 on the substrate is located within the orthographic projection of the corresponding fourth gate pattern on the substrate.

One portion of the seventh conductive portion 131 of the seventh transistor T7 corresponds to the first input electrode pattern in one-to-one correspondence, and the orthographic projection of the first input electrode pattern on the substrate and the orthographic projection of the corresponding seventh conductive portions 131 on the substrate have a second overlapping area, and the first input electrode pattern is coupled to the corresponding seventh conductive portion 131 through at least one second via hole provided in the second overlapping area.

The other portion of the seventh conductive portion 131 of the seventh transistor T7 corresponds to the first output electrode pattern in one-to-one correspondence, and the orthographic projection of the first output electrode pattern on the substrate and the orthographic projection of the corresponding seventh conductive portion 131 on the substrate have a third overlapping area, and the first output electrode pattern is coupled to the corresponding seventh conductive portion 131 through at least one third via hole provided in the third overlapping area.

The eighth transistor T8 includes two eighth active patterns arranged along the second direction, each of the eighth active patterns includes an eighth conductive portion 133 and an eighth channel portion 132. The orthographic projection of the eight conductive portion 133 on the substrate and the orthographic projection of the input electrode S8 of the eighth transistor T8 on the substrate have a fourth overlapping area. The eighth conductive portion 133 is coupled to the input electrode S8 of the eighth transistor T8 through the at least one fourth via hole in the fourth overlapping area.

The orthographic projection of the eighth channel portion 132 on the substrate is located within the orthographic projection of the gate electrode 208g of the eighth transistor T8 on the substrate.

The seventh active pattern corresponds to the eighth active pattern in one-to-one correspondence, and the seventh active pattern and the eighth active pattern corresponding to each other are formed by a continuous third semiconductor layer 13.

Specifically, the shift register unit includes two third semiconductor layers 13, the two third semiconductor layers 13 are arranged along the second direction, and each third semiconductor layer 13 can be extended along the first direction. The seventh conductive portion 131, the seventh channel portion 130, the eighth conductive portion 133, and the eighth channel portion 132 included in each of the third semiconductor layers 13 all extend along the second direction.

It is worth noting that the number of the second via holes, the third via holes and the fourth via holes can be set according to actual needs.

In the display substrate provided by the foregoing embodiment, the seventh active pattern of the seventh transistor T7 and the eighth active pattern of the eighth transistor T8 are formed by using the third semiconductor layer 13 extending along the first direction, which not only makes the space occupied by the seventh transistor T7 and the eighth transistor T8 in the second direction smaller; but also can increase the size of the seventh active pattern of the seventh transistor T7 and the size of the eighth active pattern of the eight transistor T8 in the first direction, so as to ensure the channel width of the seventh transistor T7 and the channel width of the eighth transistor T8, thereby reducing the frame width of the display substrate while ensuring the working performance of the seventh transistor T7 and the eighth transistor T8.

In some embodiments, the clock signal line, the inverted clock signal line, and the second level signal line all extend along the first direction, and the orthographic projection of the clock signal line on the substrate, the orthographic projection of the inverted clock signal line on the substrate and the orthographic projection of the second level signal line on the substrate are all located on a side of the orthographic projection of the shift register unit on the substrate away from the display area of the display substrate.

Specifically, the specific positions of the clock signal line, the inverted clock signal line, and the second-level signal line can be set according to actual needs. For example, the clock signal line, the inverted clock signal line, and the second level signal line are all arranged at the edge of the display substrate, that is, the orthographic projection of the clock signal line on the substrate, the orthographic projection of the inverted clock signal line on the substrate and the orthographic projection of the second level signal line on the substrate are all located on a side of the orthographic projection of the shift register unit on the substrate away from the display area of the display substrate. In this way, when the shift register unit is laid out, it is possible to avoid excessive overlapping between the transistors in the shift register unit and the clock signal line, the inverted clock signal line, and the second level signal line, which is more conducive to improving the working performance of the shift register unit.

In addition, by arranging the clock signal line, the inverted clock signal line, and the second level signal line to extend along the first direction, it is more conductive for the display substrate to realize a narrow frame.

The specific structures of the shift register units provided in the above embodiments are various. In some embodiments, the gate driving circuit further includes a frame start signal line STV; the plurality of transistors further include the fourth transistor T4, the fifth transistor T5, the sixth transistor T6, the seventh transistor T7 and the eighth transistor T8. The gate electrode 201g of the first transistor T1 is coupled to the clock signal line CK, and the input electrode S1 of the first transistor T1 is coupled to the frame start signal line STV, the output electrode D1 of the first transistor T1 is coupled to the gate electrode 205g of the fifth transistor T5; the input electrode S5 of the fifth transistor T5 is coupled to the clock signal line CK, the output electrode D5 of the fifth transistor T5 is coupled to the output electrode D4 of the fourth transistor T4; the gate electrode 204g of the fourth transistor T4 is coupled to the clock signal line CK, the input electrode S4 of the fourth transistor T4 is coupled to the first level signal line VGL, and the output electrode D4 of the fourth transistor T4 is coupled to the gate electrode 208g of the eighth transistor T8; the input electrode S8 of the eighth transistor T8 is coupled to the second level signal line VGH, the output electrode D8 of the eighth transistor T8 is coupled to the gate driving signal output terminal OUTPUT; the gate electrode of the seventh transistor T7 207g is coupled to the output electrode D6 of the sixth transistor T6, the input electrode S7 of the seventh transistor T7 is coupled to the inverted clock signal input terminal, and the output electrode D7 of the seventh transistor T7 is coupled to the gate driving signal output terminal OUTPUT; the gate electrode 206g of the sixth transistor T6 is coupled to the first level signal line VGL, and the input electrode S6 of the sixth transistor T6 is coupled to the output electrode D1 of the first transistor T1; the gate electrode 202g of the second transistor T2 is coupled to the output electrode D4 of the fourth transistor T4, and the input electrode S2 of the second transistor T2 is coupled to the second level signal line VGH, the output electrode D2 of the second transistor T2 is coupled to the input electrode S3 of the third transistor T3; the gate electrode 203g of the third transistor T3 is coupled to the inverted clock signal line CB, the output electrode D3 of the third transistor T3 is coupled to the input electrode S6 of the sixth transistor T6.

The shift register unit further includes: a first capacitor C1 and a second capacitor C2, the first electrode plate C1a of the first capacitor C1 is coupled to the gate electrode 208g of the eighth transistor T8, and the second electrode plate C1b of first capacitor C1 is coupled to the second level signal line VGH; the first electrode plate C2a of the second capacitor C2 is coupled to the gate electrode 207g of the seventh transistor T7, and the second electrode plate C2b of the capacitor C2 is coupled to the gate driving signal output terminal OUTPUT.

Specifically, each transistor included in the shift register unit of the above structure may be a P-type thin film transistor, but it is not limited thereto. The first level signal outputted by the first level signal line VGL can be selected as a low level signal; the second level signal outputted by the second level signal line VGH can be selected as a high level signal; the clock signal outputted by the clock signal line CK and the inverted clock signal outputted by the inverted clock signal line CB have inverted phases.

When the shift register unit adopts the above structure, there are various specific layout modes of the shift register unit, and a specific layout mode is given below.

In some embodiments, the clock signal line CK, the inverted clock signal line CB, and the second level signal line VGH are arranged in sequence along the direction close to the display area.

Along the first direction, the third transistor T3 is located between the first transistor T1 and the second transistor T2; the fourth transistor T4 is located a side of the first transistor T1 away from the second level signal line VGH.

The fifth channel portion 120 of the fifth transistor T5 is located between the first channel portion of the first transistor T1 and the fourth channel portion 123 of the fourth transistor T4, and the orthographic projection of the input electrode S5 of the fifth transistor T5 on the substrate is located between the orthographic projection of the first channel portion of the first transistor T1 on the substrate and the orthographic projection of the fifth channel portion 120 of the fifth transistor T5 on the substrate.

The common connection terminal includes the gate electrode 202g of the second transistor T2, and the output electrode D5 of the fifth transistor T5 is coupled to the gate electrode 202g of the second transistor T2 through the first conductive connection portion 501, the first conductive connection portion 501 extends along the first direction.

The first level signal line VGL is located on a side of the fourth channel portion 123 of the fourth transistor T4 away from the second level signal line VGH, and the orthographic projection of the first level signal line VGL on the substrate is located between the orthographic projection of the channel portion of the fourth transistor T4 on the substrate and the orthographic projection of the sixth channel portion of the sixth transistor T6 on the substrate.

The eighth transistor T8 and the seventh transistor T7 are located at a side of the sixth transistor T6 away from the first level signal line VGL.

When the shift register unit is laid out in the above manner, the transistors included in the shift register unit are arranged compactly, and the size of the shift register unit in the second direction is smaller, which is more conductive to the narrow frame of the display substrate.

Figure 6:
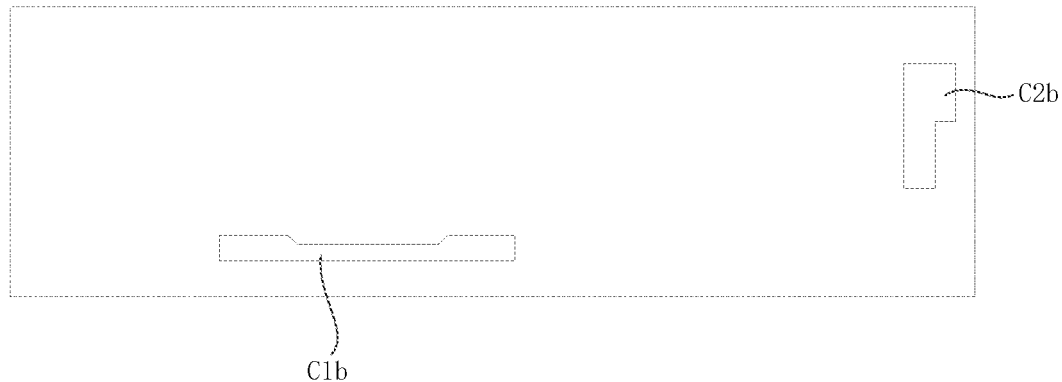

As shown in FIGS. 3, 6 and 7, in some embodiments, the shift register unit further includes a third conductive connection portion 503 coupled to the second level signal line VGH, and a fourth conductive connection portion 504 for coupling to the gate electrode 208g of the eighth transistor T8 and the gate electrode 202g of the second transistor T2, the third conductive connection portion 503 and the fourth conductive connection portion 504 both extend along the second direction.

The second electrode plate C1b of the first capacitor C1 extends along the second direction, and the orthographic projection of an end of the second electrode plate C1b of the first capacitor C1 close to the third conductive connection portion 503 on the substrate and the orthographic projection of the third conductive connection portion 503 on the substrate have a fifth overlapping area, and the end of the second electrode plate C1b of the first capacitor C1 close to the third conductive connection portion 503 is coupled to the third conductive connection portion 503 through at least one fifth via hole provided in the fifth overlapping area.

The orthographic projection of an end of the second electrode plate C1b of the first capacitor C1 close to the input electrode S8 of the eighth transistor T8 on the substrate and the orthographic projection of the input electrode S8 of the eighth transistor T8 on the substrate have a sixth overlapping area, and the end of the second electrode plate C1b of the first capacitor C close to the input electrode S8 of the eighth transistor T8 is coupled to the input electrode S8 of the eighth transistor T8 through at least one sixth via hole provided in the sixth overlapping area; the orthographic projection of the second electrode plate C1b of the first capacitor C1 on the substrate at least partially overlaps the orthographic projection of the fourth conductive connecting portion on the substrate, and the fourth conductive connection portion is multiplexed as the first electrode plate C1a of the first capacitor C1.

Specifically, since the second level signal line VGH is located on the side of the shift register unit away from the display area, the second transistor T2 is arranged close to the second level signal line VGH, and the eight transistor T8 is located close to the display area. Therefore, the fourth conductive connection portion 504 for coupling the gate electrode 208g of the eighth transistor T8 and the gate electrode 202g of the second transistor T2 can be multiplexed as the first electrode plate C1a of the first capacitor C1, and the second electrode plate C1b of the first capacitor C1 is set to overlap the fourth conductive connecting portion 504 in a direction perpendicular to the substrate, so as to form the first capacitor. When the first capacitor C1 is arranged in the above manner, the space occupied by the first capacitor C1 is effectively saved, which is more conducive to reducing the frame width of the display substrate.

As shown in FIGS. 3 and 6, in some embodiments, the second electrode plate C2b of the second capacitor C2 is located at a side of the seventh channel portion of the seventh transistor T7 away from the first level signal line VGL, the orthographic projection of the second electrode plate C2b of the second capacitor C2 on the substrate and the orthographic projection of the output electrode D7 of the seventh transistor T7 on the substrate have a seventh overlapping area, so that the second electrode plate C2b of the second capacitor C2 is coupled to the output electrode D7 of the seventh transistor T7 through the seventh via hole provided in the seventh overlapping area; the gate electrode 207g of the seventh transistor T7 is multiplexed as the first electrode plate C2a of the second capacitor C2.

Specifically, since the first electrode plate C2a of the second capacitor C2 is coupled to the gate electrode 207g of the seventh transistor T7, and the gate electrode 207g has a fifth gate pattern with a larger area, the fifth gate pattern is multiplexed as the first electrode plate C2a of the second capacitor C2; at the same time, the orthographic projection of the second electrode plate C2b of the second capacitor C2 on the substrate overlaps the orthographic projections of the fifth electrode pattern on the substrate, so that the second electrode plate C2b of the second capacitor C2 and the fifth gate pattern can form an overlap area in a direction perpendicular to the substrate.

In addition, it may be arranged that the orthographic projection of the second electrode plate C2b of the second capacitor C2 on the substrate and the orthographic projection of the output electrode D7 of the seventh transistor T7 on the substrate have a seventh overlapping area, so that the second electrode plate C2b of the second capacitor C2 can be coupled to the output electrode D7 of the seventh transistor T7 through the seventh via hole provided in the seventh overlapping area.

As shown in FIGS. 3 and 4, in some embodiments, the shift register unit further includes a fifth conductive connection portion 505 extending along the second direction; the sixth transistor T6 includes a sixth active pattern, the sixth active pattern extends along the first direction, and the sixth active pattern includes two sixth conductive portions 140 disposed opposite to each other along the first direction, and a sixth channel portion 141 between the two sixth conductive portions 140, the orthographic projection of the input electrode S6 of the sixth transistor T6 on the substrate and the orthographic projection of one sixth conductive portion 140 on the substrate have an eighth overlapping area, the input electrode S6 of the sixth transistor T6 is coupled to one of the sixth conductive portions 140 through an eighth via provided in the eighth overlapping area, and the orthographic projection of the output electrode D6 of the sixth transistor T6 on the substrate and the orthographic projection of the other sixth conductive portion 140 on the substrate have a ninth overlapping area, and the output electrode D6 of the sixth transistor T6 is coupled to the other sixth conductive portion 140 through a ninth via hole provided in the ninth overlapping area. The input electrode S6 of the sixth transistor T6 is respectively coupled to the output electrode D1 of the first transistor T1 and the gate electrode 205g of the fifth transistor T5 through the fifth conductive connection portion 505.

The sixth transistor T6 is arranged in the above-mentioned structure, so that the sixth transistor T6 has a smaller size in the second direction, thereby reducing the width of the frame of the display substrate. In addition, the input electrode S6 of the sixth transistor T6 is respectively coupled to the output electrode D1 of the first transistor T1 and the gate electrode 205g of the fifth transistor T5 through the fifth conductive connection portion 505, thereby further simplifying the overall layout of the shift register unit.

An embodiment of the present disclosure provides a display substrate, including: a substrate, and a gate driving circuit provided on the substrate; the gate driving circuit includes: a frame start signal line STV, a clock signal line CK, an inverted clock signal line CB, a first level signal line VGL, a second level signal line VGH, and a plurality of shift register units. The frame start signal line STV, the clock signal line CK, the inverted clock signal line CB, the first level signal line VGL, and the second level signal line VGH all extend along the first direction; the shift register unit includes a gate driving signal output terminal OUTPUT, and each shift register unit includes a plurality of transistors including a seventh transistor T7 and an eighth transistor T8 arranged along the first direction, and the seventh transistor T7 includes a seventh transistor input electrode pattern, a seventh transistor output electrode pattern and a seventh transistor gate pattern, the orthographic projection of the seventh transistor gate pattern on the substrate is located between the orthographic projection of the seventh transistor input electrode pattern on the substrate and the orthographic projection of the seventh transistor output electrode pattern on the substrate, the eighth transistor T8 includes an eighth transistor input electrode pattern, an eighth transistor output electrode pattern, and an eighth transistor gate pattern. The orthographic projection of the eighth transistor gate pattern on the substrate is located between the orthographic projection of the eighth transistor input electrode pattern on the substrate and the orthographic projection of the eighth transistor output electrode pattern on the substrate, and the seventh transistor output electrode pattern is multiplexed as the eighth transistor output electrode pattern.

The seventh transistor input electrode pattern, the seventh transistor output electrode pattern, the seventh transistor gate pattern, the eighth transistor input electrode pattern, and the eighth transistor gate pattern all extend along the second direction, and the second direction intersects the first direction intersects.

The seventh transistor output electrode pattern and the eighth transistor output electrode pattern are both coupled to the gate driving signal output terminal OUTPUT; the seventh transistor T7 is used to control the gate driving signal output terminal OUTPUT to output a valid level, the eighth transistor T8 is used to control the gate driving signal output terminal OUTPUT to output an invalid level.

Specifically, the display area of the display substrate includes a plurality of gate lines and a plurality of data lines, and a plurality of sub-pixels defined by the plurality of gate lines and the plurality of data lines; the plurality of shift register units included in the gate driving circuit corresponds to the plurality of gate lines in one-to-one correspondence, and the gate driving signal output terminal of each shift register unit is coupled to the corresponding gate line for providing a gate driving circuit for the corresponding gate line.

The shift register unit further includes a seventh transistor T7 and an eighth transistor T8 arranged along the first direction, and the seventh transistor output electrode pattern and the eighth transistor output electrode pattern are both coupled to the gate driving signal output terminal OUTPUT, the seventh transistor input electrode pattern is coupled to the inverted clock signal line CB, the eighth transistor input electrode pattern is coupled to the second level signal line VGH, and the seventh transistor input electrode pattern is coupled to the second level signal line VGH. The seventh transistor T7 can control the gate driving signal output terminal to output a valid level, and the eighth transistor T8 can control the gate driving signal output terminal to output an invalid level.

In the display substrate provided by the embodiment of the present disclosure, the frame start signal line STV, the clock signal line CK, the inverted clock signal line CB, the first level signal line VGL and the second level signal lines VGH all extend along the first direction; and the seventh transistor T7 and the eighth transistor T8 included in the shift register unit are arranged along the first direction, so that the frame start signal line STV, the clock signal line CK, the inverted clock signal line CB, the first level signal line VGL, the second level signal line VGH, the seventh transistor T7 and the eight-transistor T8 occupies a small space in the second direction, which is conductive to reduce the frame width of the display substrate.

In addition, in the display substrate provided by the embodiment of the present disclosure, the seventh transistor output electrode pattern is multiplexed as the eighth transistor output electrode pattern, so that the seventh transistor and the eighth transistor occupy a smaller layout space in the first direction, which is conductive to further reduce the frame width of the display substrate.

As shown in FIGS. 3, 5, and 7, in some embodiments, the seventh transistor input electrode pattern includes a plurality of first input electrode patterns arranged along the first direction, and a plurality of second input electrode patterns arranged on the same side of the first input electrode patterns and coupled to the plurality of first input electrode patterns; the seventh transistor output electrode pattern includes a plurality of first output electrode patterns, and a plurality of second output electrode patterns arranged on the same side of the plurality of first output electrode patterns and respectively coupled to the plurality of first output electrode patterns, the first output electrode patterns and the first input electrode patterns are arranged alternately; the seventh transistor gate pattern includes a plurality of fourth gate patterns, and a plurality of fifth gate patterns located on the same side of the plurality of fourth gate patterns and respectively coupled to the plurality of fourth gate patterns, each of the fourth gate patterns is located between the first input electrode pattern and the first output electrode pattern adjacent to each other.

The orthographic projection of the eighth transistor gate pattern on the substrate is located between the orthographic projection of the eighth transistor input electrode pattern on the substrate and the orthographic projection of the eighth transistor output electrode pattern on the substrate, the first output electrode pattern of the seventh transistor T7 closest to the gate pattern of the eighth transistor is multiplexed as the eighth transistor output electrode pattern.

The first input electrode pattern, the first output electrode pattern, the fourth gate pattern, the eighth transistor gate pattern, and the eighth transistor input electrode pattern all extend along the second direction, and the second direction intersects the first direction.

Specifically, the specific numbers of the first input electrode pattern, the first output electrode pattern, and the fourth gate pattern can be set according to actual needs. For example, as shown in FIG. 7, there are two first input electrode patterns, two first output electrode patterns, and three fourth gate patterns. In addition, the specific layout positions of the second input electrode pattern, the second output electrode pattern, and the fifth gate pattern can be set according to actual needs. For example, the second input electrode pattern is located on a side of the first input electrode pattern away from the display area of the display substrate, and the second output electrode pattern is located at a side of the first output electrode pattern close to the display area, and the fifth gate pattern is located on a side of the fourth gate pattern close to the display area; this layout is more convenient for the second input electrode pattern to be coupled with other functional patterns in the shift register unit on the side of the first input electrode pattern away from the display area of the display substrate, which is convenient for the second output electrode pattern to be coupled to the gate driving signal output terminal OUTPUT in the shift register unit.

In addition, the seventh transistor T7 with the above structure has better driving performance and can be turned on and off quickly.

Since the eighth transistor output electrode pattern and the seventh transistor output electrode pattern are both coupled to the gate driving signal output terminal OUTPUT, when the eighth transistor T8 is laid out, the first output electrode pattern of the seventh transistor T7 closest to the gate pattern of the eighth transistor is multiplexed as the eighth transistor output electrode pattern, which can further reduce the layout space of the seventh transistor T7 and the eighth transistor T8 and is conducive to a narrow frame of the display substrate.

As shown in FIGS. 3 and 4, in some embodiments, the seventh transistor T7 includes two seventh active patterns arranged along the second direction, and each seventh active pattern includes the seventh conductive portion 131 and the seventh channel portion 130 alternately arranged in the first direction.

The seventh channel portions 130 correspond to the fourth gate patterns in one-to-one correspondence, and the orthographic projection of each seventh channel portion 130 on the substrate is located within the orthographic projection of the corresponding fourth gate pattern on the substrate.

One portion of the seventh conductive portions 131 of the seventh transistor T7 corresponds to the first input electrode patterns in one-to-one correspondence, and the orthographic projection of the first input electrode pattern on the substrate and the orthographic projection of the corresponding seven conductive portions 131 on the substrate have a second overlapping area, and the first input electrode pattern is coupled to the corresponding seventh conductive portion 131 through at least one second via hole provided in the second overlapping area.

The other portion of the seventh conductive portions 131 of the seventh transistor T7 correspond to the first output electrode patterns in one-to-one correspondence, and the orthographic projection of the first output electrode pattern on the substrate and the orthographic projection of the seventh conductive portion 131 on the substrate have a third overlapping area, and the first output electrode is coupled to the corresponding seventh conductive portion 131 through at least one third via hole provided in the third overlapping area.

The eighth transistor T8 includes two eighth active patterns arranged along the second direction, each eighth active pattern includes an eighth conductive portion 133 and an eighth channel portion 132. The orthographic projection of the eight conductive portion 133 on the substrate and the orthographic projection of the eighth transistor input electrode pattern on the substrate have a fourth overlapping area. The eighth conductive portion 133 is coupled to the eighth transistor input electrode pattern through at least one fourth via hole provided in the fourth overlapping area.

The orthographic projection of the eighth channel portion 132 on the substrate is located within the orthographic projection of the eighth transistor gate pattern on the substrate.

The seventh active patterns correspond to the eighth active patterns in one-to-one correspondence, and the seventh active pattern and the eighth active pattern corresponding to each other are formed by a continuous third semiconductor layer 13.

Specifically, the shift register unit includes two third semiconductor layers 13, the two third semiconductor layers 13 are arranged along the second direction, and each third semiconductor layer 13 can be extended along the first direction. The seventh conductive portion 131, the seventh channel portion 130, the eighth conductive portion 133, and the eighth channel portion 132 included in each third semiconductor layer 13 all extend along the second direction.

It is worth noting that the number of the second via holes, the third via holes and the fourth via holes can be set according to actual needs.

In the display substrate provided by the foregoing embodiment, the seventh active pattern of the seventh transistor T7 and the eighth active pattern of the eighth transistor T8 are formed by using the third semiconductor layer 13 extending along the first direction, which not only makes the space occupied by the seventh transistor T7 and the eighth transistor T8 in the second direction smaller; but also can increase the size of the seventh active pattern of the seventh transistor T7 and the size of the eighth active pattern of the eight transistor T8 in the first direction, thereby ensuring the channel width of the seventh transistor T7 and the eighth transistor T8, thereby reducing the frame width of the display substrate while ensuring working performance of the eighth transistor T8.

As shown in FIGS. 3 and 4, in some embodiments, the plurality of transistors at least include a first transistor T1, a second transistor T2, and a third transistor T3. The active layer of the first transistor T1, the active layer of the second transistor T2 and the active layer of the third transistor T3 are formed by a continuous first semiconductor layer 11, the first semiconductor layer 11 extends along the first direction; the first semiconductor layer 11 includes at least three channel portions (110 in FIG. 4) corresponding to the first transistor T1, the second transistor T2, and the third transistor T3, and the conductive portion (111 in FIG. 4) arranged between adjacent channel portions. The at least three channel portions are arranged along the first direction, and the transistors corresponding to the adjacent channel portions are coupled to each other through the corresponding conductive portion.

Specifically, the active layer of the first transistor T1, the active layer of the second transistor T2, and the active layer of the third transistor T3 are formed by a continuous first semiconductor layer 11, and the overlapping area between the orthographic projection of the first semiconductor layer 11 on the substrate and the orthographic projection of the gate electrode 201g of the first transistor T1, the gate electrode 202g of the second transistor T2, and the gate electrode 203g of the third transistor T3 on the substrate is used as at least three channel portions corresponding to the first transistor T1, the second transistor T2, and the third transistor T3 (110 in FIG. 4); in the first semiconductor layer 11, a portion between the adjacent channel portions is the conductive portion (111 in FIG. 4), and the transistors corresponding to the adjacent channel portions are coupled through the corresponding conductive portions.

In the first transistor T1, the second transistor T2, and the third transistor T3, the conductive portions located on both sides of the channel portion of each transistor can respectively serve as the input electrode and the output electrode of the transistor, so that in the first transistor T1, the second transistor T2, and the third transistor T3, adjacent transistors can reuse the same conductive portion as their input electrodes or output electrodes, and the adjacent transistors are electrically connected to each other through the conductive portion between the channel portions of the adjacent transistors.

It is worth noting that when the first semiconductor layer 11 is formed, for example, the first semiconductor material layer may be formed first, and then the gate electrode 201g of the first transistor T1, the gate electrode 202g of the second transistor T2 and the gate electrode 203g of the third transistor T3, the gate electrode 201g of the first transistor T1, the gate electrode 202g of the second transistor T2, and the gate electrode 203g of the third transistor T3 are used as masks, and a portion of the first semiconductor material layer not covered by the gate electrode of each transistor is doped, so that the portion of the first semiconductor material layer not covered by the gate electrode of each transistor is formed as the conductive portion, and a portion of the first semiconductor material layer covered by the gate electrode of each transistor is formed as the channel portion.

When the first transistor T1, the second transistor T2, and the third transistor T3 are in operation, the signal can be transmitted to the first transistor T1, the second transistor T2, and the third transistor T3 sequentially, or, when the first transistor T1, the third transistor T3, and the second transistor T2 are coupled in sequence, a coupled node between the first transistor T1 and the third transistor T3 serves as a common output terminal, the signal transmitted by the first transistor T1 and the signals transmitted by the third transistor T3 and the second transistor T2 can be output from the common output terminal.

According to the specific structure of the above display substrate, in the display substrate provided by the embodiment of the present disclosure, the first transistor T1, the second transistor T2, and the third transistor T3 in the shift register unit can be arranged along the first direction, thereby reducing the area occupied by the shift register unit in the second direction. Moreover, among the first transistor T1, the second transistor T2, and the third transistor T3, the adjacent transistors can be directly coupled to each other through the conductive portion included in the first semiconductor layer 11, which reduces the area occupied by the first transistor T1, the second transistor T2, and the third transistor T3 in the first direction. Therefore, in the display substrate provided by the embodiments of the present disclosure, the shift register unit included in the display substrate can occupy a smaller area in both the first direction and the second direction, thereby making the display substrate more consistent with narrow frame needs.

As shown in FIGS. 3 and 5, in some embodiments, the gate electrode 201g of the first transistor T1 includes: a first gate pattern 2010, a second gate pattern 2011, and a third gate pattern 2012.

Both the orthographic projection of the first gate pattern 2010 on the substrate and the orthographic projection of the second gate pattern 2011 on the substrate at least partially overlap the orthographic projection of the channel portion of the first transistor T1 on the substrate, the first gate pattern 2010 and the second gate pattern 2011 both extend along the second direction, and the second direction intersects the first direction.

The third gate pattern 2012 is located on a side of the channel portion of the first transistor T1 away from the second level signal line VGH, and the third gate pattern 2012 is respectively coupled to the first gate pattern 2010 and the second gate pattern 2011.

An end of the first gate pattern 2010 away from the third gate pattern 2012 or an end of the second gate pattern 2011 away from the third gate pattern 2012 is coupled to the clock signal line CK.

Specifically, the first transistor T1 is set to the above-mentioned structure, so that the first transistor T1 has a double-gate structure, and when the first transistor T1 occupies a smaller space, the gate electrode 201g of the first transistor T1 is respectively coupled to the clock signal line CK and the gate electrode 205g of the fifth transistor T5.

In some embodiments, the width to length ratio of the channel of the first transistor T1, the width to length ratio of the channel of the second transistor T2 and the width to length ratio of the channel of the third transistor T3 are the same.

Specifically, the size of the channel portions of the first transistor T1, the second transistor T2, and the third transistor T3 can be set according to actual needs. For example, the width to length ratio of the channel of the first transistor T1, the width to length ratio of the channel of the second transistor T2 and the width to length ratio of the channel of the third transistor T3 are set the same. This arrangement makes the first transistor T1 and the second transistor T2 and the third transistor T3 have the same driving performance, which is more conducive to the operation stability of the shift register unit.

Further, the width to length ratio of the channel of the first transistor T1 can be realized in various ways, and the width to length ratio of the channel of the second transistor T2 and the width to length ratio of the channel of the third transistor T3 are the same. For example, in the second direction, the length of the channel portion of the second transistor T2 is set to be the same as the length of the channel portion of the third transistor T3, and the length of the channel portion of the second transistor T2 is less than the length of the channel portion of the first transistor T1; in the first direction, the width of the channel portion of the second transistor T2 is the same as the width of the channel portion of the third transistor T3, and the width of the channel portion of the second transistor T2 is less than the width of the channel portion of the first transistor T1.

In some embodiments, the active layer of the first transistor T1 includes two first conductive portions arranged opposite to each other along the first direction, and a first channel portion located between the two first conductive portions; the active layer of the second transistor T2 includes two second conductive portions arranged opposite to each other along the first direction, and a second channel portion located between the two second conductive portions; the active layer of the third transistor T3 includes two third conductive portions arranged opposite to each other along the first direction, and a third channel portion located between the two third conductive portions; the third channel portion is located between the first channel portion and the second channel portion, and the first conductive portion located between the first channel portion and the third channel portion is coupled to the third conductive portion, and the second conductive portion located between the second channel portion and the third channel portion is coupled to the third conductive portion.

Specifically, the specific structures of the active layer of the first transistor T1, the active layer of the second transistor T2, and the active layer of the third transistor T3 are various. In the first direction, the first transistor T1, the third transistor T3, and the second transistor T2 are arranged in sequence. The active layer of each of the first transistor T1, the third transistor T3, and the second transistor T2 includes two conductive portions arranged opposite to each other along the first direction, and a channel portion between the two conductive portions. This structure makes the first transistor T1 and the third transistor T3 and the second transistor T2 occupy the smallest space in the second direction, thereby further reducing the size of the shift register unit in the second direction.

As shown in FIGS. 3 and 4, in some embodiments, the shift register unit further includes a common connection terminal; the plurality of transistors further include a fourth transistor T4 and a fifth transistor T5. The active layer of the fourth transistor T4 and the active layer of the fifth transistor T5 are formed by a continuous second semiconductor layer 12; the active layer of the fourth transistor T4 includes two fourth conductive portions 124 arranged opposite to each other, and the fourth channel portion 123 arranged between the two fourth conductive portions 124; the active layer of the fifth transistor T5 includes two fifth conductive portions 121 arranged opposite to each other, and the fifth channel portion 120 arranged between the two fifth conductive portions 121; one of the fourth conductive portions 124 and one of the fifth conductive portions 121 are coupled to form a coupling end, and the coupling end is coupled to the common connection terminal through the first conductive connecting portion 501.

Specifically, the shift register unit further includes a fourth transistor T4 and a fifth transistor T5 coupled to the common connection terminal, and the active layer of the fourth transistor T4 and the active layer of the fifth transistor T5 may be formed by a continuous second semiconductor layer 12, an overlapping area between the orthographic projection of the second semiconductor layer 12 on the substrate and the orthographic projection of the gate electrode 204g of the fourth transistor T4 on the substrate is used as the fourth channel portion 123 of the fourth transistor T4, an overlapping area between the orthographic projection of the second semiconductor layer 12 on the substrate and the orthographic projection of the gate electrode 205g of the fifth transistor T5 on the substrate is used as the fifth channel portion 120 of the fifth transistor T5; an overlapping area between the orthographic projection of the second semiconductor layer 12 on the substrate and the orthographic projection of the input electrode S4 and the output electrode D4 of the fourth transistor T4 on the substrate is the fourth conductive portion 124 of the fourth transistor T4, and an overlapping area between the orthographic projection of the second semiconductor layer 12 on the substrate and the orthographic projections of the input electrode S5 and the output electrode D5 of the fifth transistor T5 on the substrate is used as the fifth conductive portion 121 of the fifth transistor T5.

It is worth noting that of the two fourth conductive portions 124 are included in the fourth transistor T4, one of the fourth conductive portions 124 can be used as the input electrode S4 of the fourth transistor T4, and the other fourth conductive portion 124 can be used as the output electrode D4 of the fourth transistor T4; two fifth conductive portions 121 are included in the fifth transistor T5, one of the fifth conductive portions 121 can be used as the input electrode S5 of the fifth transistor T5, and the other fifth conductive portion 121 can be used as the output electrode D5 of the fifth transistor T5.

The fourth channel portion 123 and the fourth conductive portion 124 of the fourth transistor T4, and the fifth channel portion 120 and the fifth conductive portion of the fifth transistor T5 are formed by one of the second semiconductor layers 12, so that the fourth channel portion 123 and the fourth conductive portion 124 of the fourth transistor T4, and the fifth channel portion 120 and the fifth conductive portion 121 of the fifth transistor T5 are formed the same time through one patterning process and one doping process. Moreover, one fourth conductive portion 124 and one fifth conductive portion 121 are coupled to form the coupling end, so that the same conductive portion is reused by the fourth conductive portion 124 and the fifth conductive portion 121, thereby effectively reducing the layout space occupied by the fourth transistor T4 and the fifth transistor T5. In addition, the fourth transistor T4 and the fifth transistor T5 of the above-mentioned structure enable the coupling end and the common connection end to be coupled by only one of the first conductive connection portions 501 to couple both the fourth transistor T4 and the fifth transistor T5 to the common connection terminal, so as to avoid providing a dedicated conductive connection portion for each transistor that needs to be coupled to the common connection terminal, thereby further reducing the overall layout space of the shift register unit.

As shown in FIG. 4, in some embodiments, the two fourth conductive portions 124 are oppositely arranged along the first direction, the two fifth conductive portions 121 are oppositely arranged along the second direction, and the second direction intersects the first direction; the active layer of the fourth transistor T4 and the active layer of the fifth transistor T5 are formed together in an L shape, and the coupling end is located at the corner of the L shape.

Specifically, the specific layout of the fourth transistor T4 and the fifth transistor T5 can be set according to actual needs. For example, the second semiconductor layer 12 is formed into an L shape, and one side of the L shape extends along the first direction to form the two fifth conductive portions 121 and the fifth channel portions 120, and the other side of the L shape extends along the second direction to form the two fourth conductive portions 124 and the fourth channel portions 123. In the fourth transistor T4 and the fifth transistor T5, the fifth conductive portion 121 and the fourth conductive portion 124 for forming the coupling end may be located the corner of the L-shape.

In the foregoing, the active layer of the fourth transistor T4 and the active layer of the fifth transistor T5 are formed into an L shape together, so that the coupling end is located at the corner of the L shape, which is more conducive to reducing the distance between the coupling end and the common connection end, and reducing the layout space of the first conductive connection portion, so that the display substrate is more in line with the development demand of narrow frame.

As shown in FIG. 3, in some embodiments, the first level signal line VGL extends along the first direction; the plurality of transistors further include the fourth transistor and the sixth transistor coupled to the first level signal line, an orthographic projection of one electrode of the fourth transistor coupled to the first level signal line VGL on the substrate, and an orthographic projection of one electrode of the sixth transistor coupled to the first level signal line VGL on the substrate each has a first overlapping area with the orthographic projection of the first level signal line VGL on the substrate. One electrode of the fourth transistor and the One electrode of the six transistors are directly coupled to the first level signal line VGL through the first via hole provided in the first overlapping region.

Specifically, the shift register unit further includes a fourth transistor and a sixth transistor respectively coupled to the first level signal line VGL, and the fourth transistor and the sixth transistor may both be provided in the vicinity of the first level signal line VGL, an orthographic projection of one electrode of the fourth transistor coupled to the first level signal line VGL on the substrate and an orthographic projection of one electrode of the sixth transistor coupled to the first level signal line VGL on the substrate each has a first overlapping area with the orthographic projection of the first level signal line VGL on the substrate. When one electrode of the fourth transistor and the sixth transistor coupled to the first level signal line VGL is arranged in different layers from the first level signal line VGL, the first via hole is provided in the first overlapping area, so that one electrode of the fourth transistor and the sixth transistor can be directly coupled to the first level signal line VGL through the first via hole.

The foregoing manner of coupling the fourth transistor and the sixth transistor to the first level signal line VGL avoids the addition of a dedicated conductive connection portion for coupling the first level signal line VGL and the sixth transistor, thereby further reducing the area occupied by the shift register unit on the display substrate.

In some embodiments, an orthographic projection of the fourth channel portion of the fourth transistor on the substrate and an orthographic projection of the sixth channel portion of the sixth transistor on the substrate may be located at the same side of the orthographic projection of the first level signal line VGL on the substrate.

Specifically, when the layout of the shift register unit is actually performed, the orthographic projection of the fourth channel portion included in the fourth transistor on the substrate and the orthographic projection of the sixth channel portion included in the sixth transistor on the substrate are both located at the same side of the orthographic projection of the first level signal line VGL on the substrate, that is, the fourth transistor and the sixth transistor are both located at the same side of the first level signal line VGL; in this case, the fourth transistor and the sixth transistor can also be arranged in sequence along the first direction, so as to minimize the area occupied by the fourth transistor, the sixth transistor and the first level signal line VGL on the display substrate.

In some embodiments, an orthographic projection of the fourth channel portion included in the fourth transistor on the substrate may be further located at the first side of the orthographic projection of the first level signal line VGL on the substrate. The orthographic projection of the sixth channel portion included in the sixth transistor on the substrate is located at the second side of the orthographic projection of the first level signal line VGL on the substrate. The first side is opposite to the second side.

Specifically, as shown in FIG. 3, when the layout of the shift register unit is actually performed, the orthographic projection of the fourth channel portion included in the fourth transistor T4 on the substrate can be located at the first side of the orthographic projection of the first level signal line VGL on the substrate according to actual needs, and the orthographic projection of the sixth channel portion included in the sixth transistor T6 on the substrate is located at the second side of the orthographic projection of the first level signal line VGL on the substrate, that is, the fourth transistor T4 and the sixth transistor T6 are respectively located on opposite sides of the first level signal line VGL. This arrangement is more convenient for the fourth transistor T4 to be coupled to other functional patterns at the first side, and it is more convenient for the sixth transistor T6 to be coupled to other functional patterns at the second side.

In some embodiments, the first overlapping area formed by one electrode of the fourth transistor and the first level signal line may be set to be independent from the first overlapping area formed by the first electrode of the sixth transistor and the first level signal line.

Specifically, when laying out the fourth transistor and the sixth transistor, the first overlapping area formed by one electrode of the fourth transistor and the first level signal line may be set to be independent from the first overlapping area formed by the first electrode of the sixth transistor and the first level signal line, or alternatively, the first overlapping area formed by one electrode of the fourth transistor and the first level signal line may be set to overlap the first overlapping area formed by the first electrode of the sixth transistor and the first level signal line.

In some embodiments, the clock signal line, the inverted clock signal line, and the second level signal line all extend along the first direction, and the orthographic projection of the clock signal line on the substrate, the orthographic projection of the inverted clock signal line on the substrate and the orthographic projection of the second level signal line on the substrate are all located at a side of the orthographic projection of the shift register unit on the substrate away from the display area of the display substrate.

Specifically, the specific positions of the clock signal line, the inverted clock signal line, and the second level signal line can be set according to actual needs. For example, the clock signal line, the inverted clock signal line, and the second level signal line are all arranged at the edge of the display substrate, that is, the orthographic projection of the clock signal line on the substrate, and the orthographic projection of the inverted clock signal line on the substrate and the orthographic projection of the second level signal line on the substrate are all located at a side of the orthographic projection of the shift register unit on the substrate away from the display area of the display substrate. Under this arrangement, it is possible to avoid excessive overlapping between the transistors in the shift register unit and the clock signal line, the inverted clock signal line, and the second level signal line, which is more conducive to improving the working performance of the shift register unit.

In addition, by arranging the clock signal line, the inverted clock signal line, and the second level signal line to extend along the first direction, it is more conductive for the display substrate to realize a narrow frame.

The specific structures of the shift register unit provided in the above embodiments are various. In some embodiments, the gate driving circuit further includes a frame start signal line STV; the plurality of transistors further include the fourth transistors T4, the fifth transistor T5, the sixth transistor T6, the seventh transistor T7, and the eighth transistor T8; the gate electrode 201g of the first transistor T1 is coupled to the clock signal line CK, and the input electrode S1 of the first transistor T1 is connected to the frame start signal line STV, the output electrode D1 of the first transistor T1 is coupled to the gate electrode 205g of the fifth transistor T5; the input electrode S5 of the fifth transistor T5 is coupled to the clock signal line CK, the output electrode D5 of the fifth transistor T5 is coupled to the output electrode D4 of the fourth transistor T4; the gate electrode 204g of the fourth transistor T4 is coupled to the clock signal line CK, so the input electrode S4 of the fourth transistor T4 is coupled to the first level signal line VGL, and the output electrode D4 of the fourth transistor T4 is coupled to the gate electrode 208g of the eighth transistor T8; the input electrode S8 of the transistor T8 is coupled to the second level signal line VGH, the output electrode D8 of the eighth transistor T8 is coupled to the gate driving signal output terminal OUTPUT; the gate electrode 207g of the seventh transistor T7 is coupled to the output electrode D6 of the sixth transistor T6, the input electrode S7 of the seventh transistor T7 is coupled to the inverted clock signal input terminal, and the output electrode D7 of the seventh transistor T7 is coupled to the gate driving signal output terminal OUTPUT; the gate electrode 206g of the sixth transistor T6 is coupled to the first level signal line VGL, and the input electrode S6 of the sixth transistor T6 is coupled to the output electrode D1 of the first transistor T1; the gate electrode 202g of the second transistor T2 is coupled to the output electrode D4 of the fourth transistor T4, and the input electrode S2 of the second transistor T2 is coupled to the second level signal line VGH, the output electrode D2 of the second transistor T2 is coupled to the input electrode S3 of the third transistor T3; the gate electrode 203g of the third transistor T3 is coupled to the inverted clock signal line CB, the output electrode D3 of the third transistor T3 is coupled to the input electrode S6 of the sixth transistor T6.

The shift register unit further includes: a first capacitor C1 and a second capacitor C2, the first electrode plate C1a of the first capacitor C1 is coupled to the gate electrode 208g of the eighth transistor T8, and the second electrode plate C1b of the first capacitor C1 is coupled to the second level signal line VGH; the first electrode plate C2a of the second capacitor C2 is coupled to the gate electrode 207g of the seventh transistor T7, and the second electrode plate C2b of the second capacitor C2 is coupled to the gate driving signal output terminal OUTPUT.

Specifically, each transistor included in the shift register unit of the above structure may be a P-type thin film transistor, but it is not limited thereto. The first level signal outputted by the first level signal line VGL can be selected as a low level signal; the second level signal outputted by the second level signal line VGH can be selected as a high level signal; the clock signal outputted by the clock signal line CK and the inverted clock signal outputted by the inverted clock signal line CB have inverted phases.

When the shift register unit adopts the above structure, there are various specific layout modes of the shift register unit, and a specific layout mode is given below.

In some embodiments, along the direction close to the display area, the clock signal line CK, the inverted clock signal line CB, and the second level signal line VGH are arranged in sequence.

Along the first direction, the third transistor T3 is located between the first transistor T1 and the second transistor T2; the fourth transistor T4 is located a side of the first transistor T1 away from the second level signal line VGH.

The fifth channel portion 120 of the fifth transistor T5 is located between the first channel portion of the first transistor T1 and the fourth channel portion 123 of the fourth transistor T4, and the orthographic projection of the input electrode S5 of the fifth transistor T5 on the substrate is arranged between the orthographic projection of the first channel portion of the first transistor T1 on the substrate and the orthographic projection of the fifth channel portion 120 of the fifth transistor T5 on the substrate.

The common connection terminal includes the gate electrode 202g of the second transistor T2, and the output electrode D5 of the fifth transistor T5 is coupled to the gate electrode 202g of the second transistor T2 through the first conductive connection portion 501, the first conductive connection portion 501 extends along the first direction.

The first level signal line VGL is located on the side of the fourth channel portion 123 of the fourth transistor T4 away from the second level signal line VGH, and the orthographic projection of the first level signal line VGL on the substrate is located between the orthographic projection of the channel portion of the fourth transistor T4 on the substrate and the orthographic projection of the sixth channel portion of the sixth transistor T6 on the substrate.

The eighth transistor T8 and the seventh transistor T7 are located on the side of the sixth transistor T6 away from the first level signal line VGL.

When the shift register unit is laid out in the above manner, the transistors included in the shift register unit are arranged compactly, and the size of the shift register unit in the second direction is smaller, which is more beneficial the narrow frame of the display substrate.

As shown in FIGS. 3, 6 and 7, in some embodiments, the shift register unit further includes a third conductive connection portion 503 coupled to the second level signal line VGH, and a fourth conductive connection portion 504 for coupling the gate electrode 208g of the eighth transistor T8 and the gate electrode 202g of the second transistor T2, the third conductive connection portion 503 and the fourth conductive connection portion 504 both extend along the second direction.

The second electrode plate C1b of the first capacitor C1 extends along the second direction, and the orthographic projection of an end of the second electrode plate C1b of the first capacitor C1 close to the third conductive connection portion 503 on the substrate and the orthographic projection of the third conductive connection portion 503 on the substrate have a fifth overlapping area, and the end of the second electrode plate C1b of the first capacitor C1 close to the third conductive connection portion 503 is coupled to the third conductive connection portion 503 through at least one fifth via hole provided in the fifth overlapping area.

The orthographic projection of an end of the second electrode plate C1b of the first capacitor C1 close to the input electrode S8 of the eighth transistor T8 on the substrate, and the orthographic projection of the input electrode S8 of the eighth transistor T8 on the substrate have a sixth overlapping area, and the end of the second electrode plate C1b of the first capacitor C close to the input electrode S8 of the eighth transistor T8 is coupled to the input electrode S8 of the eighth transistor T8 through at least one sixth via hole provided in the sixth overlapping area. The orthographic projection of the second electrode plate C1b of the first capacitor C1 on the substrate at least partially overlaps the orthographic projection of the fourth conductive connecting portion on the substrate, and the fourth conductive connection portion is multiplexed as the first electrode plate C1a of the first capacitor C1.

Specifically, since the second level signal line VGH is located at the side of the shift register unit away from the display area, the second transistor T2 is arranged close to the second level signal line VGH, and the eight transistor T8 is located close to the display area. Therefore, the fourth conductive connection portion 504 for coupling the gate electrode 208g of the eighth transistor T8 and the gate electrode 202g of the second transistor T2 can be multiplexed as the first electrode plate C1a of the first capacitor C1, and the second electrode plate C1b of the first capacitor C1 is set to overlap the fourth conductive connecting portion 504 in a direction perpendicular to the substrate, so as to form the first capacitor C1. When the first capacitor C1 is arranged in the above manner, the space occupied by the first capacitor C1 is effectively saved, which is more conducive to reducing the frame width of the display substrate.

As shown in FIGS. 3 and 6, in some embodiments, the second electrode plate C2b of the second capacitor C2 is located at a side of the seventh channel portion of the seventh transistor T7 away from the first level signal line VGL, the orthographic projection of the second electrode plate C2b of the second capacitor C2 on the substrate and the orthographic projection of the output electrode D7 of the seventh transistor T7 on the substrate have a seventh overlapping area, so the second electrode plate C2b of the second capacitor C2 is coupled to the output electrode D7 of the seventh transistor T7 through the seventh via hole provided in the seventh overlapping area; the gate electrode 207g of the seventh transistor T7 is multiplexed as the first electrode plate C2a of the second capacitor C2.

Specifically, since the first electrode plate C2a of the second capacitor C2 is coupled to the gate electrode 207g of the seventh transistor T7, and the gate electrode 207g has a fifth gate pattern with a larger area, the fifth gate pattern is multiplexed as the first electrode plate C2a of the second capacitor C2; at the same time, the orthographic projection of the second electrode plate C2b of the second capacitor C2 on the substrate overlaps the orthographic projection of the fifth gate electrode pattern on the substrate, so that the second electrode plate C2b of the second capacitor C2 and the fifth gate pattern can form an overlapping area in a direction perpendicular to the substrate.

In addition, it may be arranged that the orthographic projection of the second electrode plate C2b of the second capacitor C2 on the substrate and the orthographic projection of the output electrode D7 of the seventh transistor T7 on the substrate have a seventh overlapping area, so that the second electrode plate C2b of the second capacitor C2 can be coupled to the output electrode D7 of the seventh transistor T7 through the seventh via hole provided in the seventh overlapping area.

As shown in FIGS. 3 and 4, in some embodiments, the shift register unit further includes a fifth conductive connection portion 505 extending along the second direction; the sixth transistor T6 includes a sixth active pattern, the sixth active pattern extends along the first direction, and the sixth active pattern includes two sixth conductive portions 140 disposed opposite to each other along the first direction, and a sixth channel portion 141 between the two sixth conductive portions 140, the orthographic projection of the input electrode S6 of the sixth transistor T6 on the substrate and the orthographic projection of the sixth conductive portion 140 on the substrate have an eighth overlapping area, the input electrode S6 of the sixth transistor T6 is coupled to one of the sixth conductive portions 140 through an eighth via hole provided in the eighth overlapping area, and the orthographic projection of the output electrode D6 of the sixth transistor T6 on the substrate and the orthographic projection of the sixth conductive portion 140 on the substrate have a ninth overlapping area, and the output electrode D6 of the sixth transistor T6 is coupled to the other sixth conductive portion 140 through the ninth via hole provided in the ninth overlapping area. The input electrode S6 of the sixth transistor T6 is respectively coupled to the output electrode D1 of the first transistor T1 and the gate electrode 205g of the fifth transistor T5 through the fifth conductive connection portion 505.

The sixth transistor T6 is arranged in the above-mentioned structure, so that the sixth transistor T6 has a smaller size in the second direction, thereby facilitating the reduction of the frame width of the display substrate. In addition, the input electrode S6 of the sixth transistor T6 is respectively coupled to the output electrode D1 of the first transistor T1 and the gate electrode 205g of the fifth transistor T5 through the fifth conductive connection portion 505, and the overall layout of the shift register unit is further simplified.

The embodiments of the present disclosure also provide a display device, including the display substrate provided in the above-mentioned embodiments.

Since the display substrate provided by the foregoing embodiment can achieve a narrow frame, the display device provided by the embodiment of the present disclosure can also achieve the beneficial effect of having a narrower frame when the display device provided by the embodiment of the present disclosure includes the foregoing display substrate, which will not be repeated herein.

The embodiment of the present disclosure also provides a method of manufacturing the display substrate. The manufacturing method includes manufacturing a gate driving circuit on a substrate. The gate driving circuit includes a frame start signal line, a clock signal line, and an inverted clock signal line, a first level signal line, a second level signal line, and a plurality of shift register units.

Each of the shift register units includes a plurality of transistors, and the plurality of transistors at least includes a first transistor, a second transistor, and a third transistor. The step of forming the first transistor, the second transistor, and the third transistor includes: forming a continuous first semiconductor material layer extending along a first direction; forming a gate insulating layer on a side of the first semiconductor material layer away from the substrate, and the gate insulating layer covering three channel regions in the first semiconductor material layer arranged along a first direction, and exposing other regions of the first semiconductor material layer other than the three channel regions, the three channel regions corresponding to a channel portion of the first transistor and a channel portion of the second transistor and a channel portion of the third transistor in one-to-one correspondence; doping the first semiconductor material layer located in the other regions by using the gate insulating layer as a mask, so that the first semiconductor material layer located in the other regions has conductivity, so as to form conductive portions between adjacent channel portions, transistors corresponding to the adjacent channel portions are coupled to each other through the corresponding conductive portions.

Specifically, as shown in FIG. 4, a continuous first semiconductor material layer extending along the first direction may be formed first. The shape of the first semiconductor material layer is the first semiconductor layer 11 in FIG. 4. Then a gate insulating layer is formed on a side of the first semiconductor material layer away from the substrate, and the gate insulating layer covers three channel regions in the first semiconductor material layer arranged along the first direction; the channel region includes a region where the channel portion 110 in FIG. 4 is located.

Next, the first semiconductor material layer located in the other region is doped using the gate insulating layer as a mask, so that the first semiconductor material layer located in the channel region still maintains semiconductor properties, and the first semiconductor material layer located in the other regions have conductive properties to form a conductive portion located between the adjacent channel portions.

In the first transistor T1, the second transistor T2, and the third transistor T3, the conductive portions located on both sides of the channel portion of each transistor can respectively serve as the input electrode and the output electrode of the transistor, so that in the first transistor T1, the second transistor T2, and the third transistor T3, adjacent transistors can reuse the same conductive portion as their input electrode or output electrode, and the adjacent transistors can be directly coupled to each other through the conductive portion between the channel portions of the adjacent transistors.

In the display substrate manufactured by the manufacturing method provided by the embodiment of the present disclosure, the first transistor T1, the second transistor T2, and the third transistor T3 in the shift register unit can be arranged along the first direction, the area occupied by the shift register unit in the second direction is reduced; moreover, in the first transistor T1, the second transistor T2, and the third transistor T3, adjacent transistors can be directly coupled to each other through the conductive portion included in the first semiconductor layer 11, the area occupied by the first transistor T1, the second transistor T2, and the third transistor T3 in the first direction is reduced; therefore, in the display substrate provided by the disclosed embodiments, the shift register unit included in the display substrate can occupy a smaller area in both the first direction and the second direction, so that the display substrate is more in line with the narrow frame needs.

It is worth noting that, as shown in FIG. 4, in the process of forming the first semiconductor layer 11 by using the first semiconductor material layer, the second semiconductor layer 12 and the third semiconductor layer 13 and the sixth active pattern (including the sixth channel portion 141 and the sixth conductive portion 140) included in the shift register unit can be simultaneously formed.

After completing the forming of the channel portions and conductive portions shown in FIG. 4, the gate insulating layer can be formed continuously, and the first gate metal shown in FIG. 5 can be made at a side of the gate insulating layer away from the substrate. The first gate metal layer is used to form the gate electrodes of each transistor included in the shift register unit, as well as the fourth conductive connection portion 504 and the fifth conductive connection portion 505.

After completing the forming of the first gate metal layer shown in FIG. 5, a first interlayer insulating layer can be made at a side of the first gate layer away from the substrate, and then a second gate metal layer as shown in FIG. 6 can be made at a side of the first interlaying insulating layer away from the substrate. The second gate metal layer is used to form the second electrode plate C1b of the first capacitor C1 in the shift register unit, and the second electrode plate C2b of the capacitor C2.

After completing the forming of the second gate metal layer shown in FIG. 6, a second interlayer insulating layer can be made at a side of the second gate metal layer away from the substrate, and then source-drain metal layer as shown in FIG. 7 can be made at a side of the second interlayer insulating layer away from the substrate. The source-drain metal is used to form the frame start signal line STV, the clock signal line CK, and the inverted clock signal line CB, the first level signal line VGL, the second level signal line VGH, the first conductive connection portion 501, the third conductive connection portion 503, and input electrodes and output electrodes of some transistors in the shift register unit, and the like.

It should be noted that the display device may be any product or component with a display function, such as a TV, a monitor, a digital photo frame, a mobile phone, a tablet computer, etc.

Unless otherwise defined, the technical terms or scientific terms used in the present disclosure shall have the usual meanings understood by those with ordinary skills in the art. The "first", "second" and similar words used in the present disclosure do not indicate any order, quantity or importance, but are only used to distinguish different components. "Include" or "comprise" and other similar words mean that the element or item appearing before the word covers the element or item listed after the word and their equivalents, but does not exclude other elements or items Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, region or substrate is referred to as being "above" or "under" another element, the element can be "directly" above or under the other element. Or there may be intermediate elements.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising: a substrate and a gate driving circuit provided on the substrate; the gate driving circuit includes: a frame start signal line, a clock signal line, an inverted clock signal line, a first level signal line, a second level signal line, and a plurality of shift register units, wherein
each of the plurality of shift register units includes a plurality of transistors, the plurality of transistors at least include a first transistor, a second transistor, and a third transistor, an active layer of the first transistor, an active layer of the second transistor and an active layer of the third transistor are formed by a continuous first semiconductor layer, the first semiconductor layer extends along a first direction; the first semiconductor layer includes at least three channel portions corresponding to the first transistor, the second transistor and the third transistor, and a conductive portion provided between adjacent channel portions, the at least three channel portions are arranged along the first direction, transistors corresponding to the adjacent channel portions are coupled to each other through a corresponding conductive portion;
the shift register unit includes a common connection terminal;
the plurality of transistors further include a fourth transistor and a fifth transistor, and an active layer of the fourth transistor and an active layer of the fifth transistor are formed by a continuous second semiconductor layer;
the active layer of the fourth transistor includes two fourth conductive portions arranged opposite to each other, and a fourth channel portion located between the two fourth conductive portions;
the active layer of the fifth transistor includes two fifth conductive portions arranged opposite to each other, and a fifth channel portion located between the two fifth conductive portions;
one of the fourth conductive portions and one of the fifth conductive portions are coupled to form a coupling end, and the coupling end is coupled to the common connection end through a first conductive connection portion.

2. The display substrate according to claim 1, wherein a gate electrode of the first transistor comprises: a first gate pattern, a second gate pattern, and a third gate pattern;
an orthographic projection of the first gate pattern on the substrate and an orthographic projection of the second gate pattern on the substrate both partially overlap an orthographic projection of a channel portion of the first transistor on the substrate, the first gate pattern and the second gate pattern both extend along a second direction, and the second direction intersects the first direction;
the third gate pattern is located at a side of the channel portion of the first transistor away from the second level signal line, and the third gate pattern is respectively connected to the first gate pattern and the second gate pattern;
an end of the first gate pattern away from the third gate pattern or an end of the second gate pattern away from the third gate pattern is coupled to the clock signal line.

3. The display substrate according to claim 2, wherein a width to length ratio of a channel of the first transistor, a width to length ratio of a channel of the second transistor and a width to length ratio of a channel of the third transistor are the same;

wherein in the second direction, a length of the channel portion of the second transistor is the same as a length of the channel portion of the third transistor, and the length of the channel portion of the second transistor is smaller than a length of the channel portion of the first transistor;

in the first direction, a width of the channel portion of the second transistor is the same as a width of the channel portion of the third transistor, and the width of the channel portion of the second transistor is smaller than a width of the channel portion of the first transistor.

4. The display substrate according to claim 1, wherein the active layer of the first transistor includes two first conductive portions arranged opposite to each other along the first direction, and a first channel portion located between the two first conductive portions; the active layer of the second transistor includes two second conductive portions arranged opposite to each other along the first direction, and a second channel portion located between the two second conductive portions; the active layer of the third transistor includes two third conductive portions arranged opposite to each other along the first direction, and a third channel portion located between the two third conductive portions; the third channel portion is located between the first channel portion and the second channel portion, and the first conductive portion and the third conductive portion located between the first channel portion and the third channel portion are coupled to each other, and the second conductive portion and the third conductive portion located between the second channel portion and the third channel portion are coupled to each other.

5. The display substrate according to claim 1, wherein the two fourth conductive portions are arranged opposite to each other along the first direction, the two fifth conductive portions are arranged opposite to each other along the second direction, and the second direction intersects the first direction;

the active layer of the fourth transistor and the active layer of the fifth transistor are formed in an L shape together, and the coupling end is located at a corner of the L shape.

6. The display substrate according to claim 1, wherein the first level signal line extends along the first direction;

the plurality of transistors further include a fourth transistor and a sixth transistor respectively coupled to the first level signal line, and an orthographic projection of one electrode of the fourth transistor coupled to the first level signal line on the substrate and an orthographic projection of one electrode of the sixth transistor coupled to the first level signal line on the substrate have a first overlapping area with an orthographic projection of the first level signal line on the substrate, the one electrode of the fourth transistor and the one electrode of the sixth transistor both are directly coupled to the first level signal line through a first via hole provided in the first overlapping area.

7. The display substrate according to claim 6, wherein an orthographic projection of a fourth channel portion included in the fourth transistor on the substrate, and an orthographic projection of a sixth channel portion included in the sixth transistor are both located within a same side of the orthographic projection of the first level signal line on the substrate; or wherein the orthographic projection of the fourth channel portion included in the fourth transistor on the substrate is located at a first side of the orthographic projection of the first level signal line on the substrate, the orthographic projection of the sixth channel portion of the sixth transistor on the substrate is located at a second side of the orthographic projection of the first level signal line on the substrate, the first side and the second side are opposite to each other.

8. The display substrate according to claim 6, wherein a first overlapping area formed by the one electrode of the fourth transistor and the first level signal line is independent from a first overlapping area formed by the one electrode of the sixth transistor and the first level signal line.

9. The display substrate according to claim 1, wherein the shift register unit includes a gate driving signal output terminal, and the plurality of transistors include a seventh transistor and an eighth transistor arranged along the first direction, an output electrode of the seventh transistor and an output electrode of the eighth transistor are both coupled to the gate driving signal output terminal; the seventh transistor is used to control the gate driving signal output terminal to output a valid level, the eighth transistor is used to control the gate driving signal output terminal to output an invalid level.

10. The display substrate according to claim 9, wherein an input electrode of the seventh transistor includes a plurality of first input electrode patterns arranged along the first direction, and a plurality of second input electrode patterns located on the same side of the plurality of first input electrode patterns and respectively connected to the plurality of first input electrode patterns;

the output electrode of the seventh transistor includes a plurality of first output electrode patterns, and a plurality of second output electrode patterns located on the same side of the plurality of first output electrode patterns and respectively coupled to the plurality of first output electrode patterns, the first output electrode patterns and the first input electrode patterns are alternately arranged;

a gate electrode of the seventh transistor includes a plurality of fourth gate patterns, and a plurality of fifth gate patterns located on the same side of the plurality of fourth gate patterns and respectively coupled to the plurality of fourth gate patterns, each of the plurality of fourth gate patterns is located between an adjacent first input electrode pattern and an adjacent first output electrode pattern;

an orthographic projection of a gate electrode of the eighth transistor on the substrate is located between an orthographic projection of an input electrode of the eighth transistor on the substrate and the orthographic projection of the output electrode of the eighth transistor on the substrate, a first output electrode pattern of the seventh transistor closest to the gate electrode of the eighth transistor is multiplexed as the output electrode of the eighth transistor;

the first input electrode pattern, the first output electrode pattern, the fourth gate pattern, the gate electrode of the eighth transistor, and the input electrode of the eighth transistor all extend along a second direction, and the second direction intersects the first direction.

11. The display substrate according to claim 10, wherein the seventh transistor includes two seventh active patterns arranged along the second direction, and each of the two seventh active patterns includes seventh conductive portions and seventh channel portions alternately arranged along the first direction;

the seventh channel portions corresponds to the fourth gate patterns in one-to-one correspondence, and the orthographic projection of each seventh channel portion on the substrate is located within the orthographic projection of the corresponding fourth gate pattern on the substrate;

one part of the seventh conductive portions in the seventh transistor correspond to the first input electrode patterns in one-to-one correspondence, and the orthographic projection of the first input electrode pattern on the substrate and the orthographic projection of the corresponding seventh conductive portion on the substrate have a second overlapping area, and the first input electrode pattern is coupled to the corresponding seventh conductive portion through at least one second via hole provided in the second overlap area;

another part of the seventh conductive portions in the seventh transistor correspond to the first output electrode patterns in one-to-one correspondence, and the orthographic projection of the first output electrode pattern on the substrate and the orthographic projection of the corresponding seventh conductive portion on the substrate have a third overlapping area, and the first output electrode pattern is coupled to the corresponding seventh conductive portion through at least one third via hole provided in the third overlapping area;

the eighth transistor includes two eighth active patterns arranged along the second direction, each of the eighth active patterns includes an eighth conductive portion and an eighth channel portion, an orthographic projection of the eighth conductive portion on the substrate and the orthographic projection of the input electrode of the eighth transistor on the substrate have a fourth overlapping area, and the eighth conductive portion is coupled to the input electrode of the eighth transistor through at least one fourth via hole provided in the fourth overlapping area;

the orthographic projection of the eighth channel portion on the substrate is located within the orthographic projection of the gate electrode of the eighth transistor on the substrate;

the seventh active patterns have a one-to-one correspondence with the eighth active patterns, and the corresponding seventh active pattern and the eighth active pattern are formed by a continuous third semiconductor layer.

12. The display substrate according to claim 1, wherein the clock signal line, the inverted clock signal line, and the second level signal line all extend along the first direction, and an orthographic projection of the clock signal line on the substrate, an orthographic projection of the inverted clock signal line on the substrate, and an orthographic projection of the second level signal line on the substrate are all located at a side of an orthographic projection of the shift register unit on the substrate away from a display area of the display substrate.

13. The display substrate according to claim 1, wherein the gate driving circuit further comprises a frame start signal line;

the plurality of transistors further include a fourth transistor, a fifth transistor, a sixth transistor, a seventh transistor, and an eighth transistor;

a gate electrode of the first transistor is coupled to the clock signal line, an input electrode of the first transistor is coupled to the frame start signal line, and an output electrode of the first transistor is coupled to a gate electrode of the fifth transistor;

an input electrode of the fifth transistor is coupled to the clock signal line, and an output electrode of the fifth transistor is coupled to an output electrode of the fourth transistor;

a gate electrode of the fourth transistor is coupled to the clock signal line, an input electrode of the fourth transistor is coupled to the first level signal line, and the output electrode of the fourth transistor is coupled to the gate electrode of the eighth transistor;

an input electrode of the eighth transistor is coupled to the second level signal line, and an output electrode of the eighth transistor is coupled to the gate driving signal output terminal;

an gate electrode of the seventh transistor is coupled to the output electrode of the sixth transistor, an input electrode of the seventh transistor is coupled to the inverted clock signal input terminal, and an output electrode of the seventh transistor is coupled to the gate driving signal output terminal;

a gate electrode of the sixth transistor is coupled to the first level signal line, and an input electrode of the sixth transistor is coupled to the output electrode of the first transistor;

a gate electrode of the second transistor is coupled to the output electrode of the fourth transistor, an input electrode of the second transistor is coupled to the second level signal line, and an output electrode of the second transistor is coupled to the input electrode of the third transistor;

a gate electrode of the third transistor is coupled to the inverted clock signal line, and an output electrode of the third transistor is coupled to the input electrode of the sixth transistor;

the shift register unit further includes:

a first capacitor, a first electrode plate of the first capacitor is coupled to the gate electrode of the eighth transistor, and a second electrode plate of the first capacitor is coupled to the second level signal line; and, a second capacitor, a first electrode plate of the second capacitor is coupled to the gate electrode of the seventh transistor, and a second electrode plate of the second capacitor is coupled to the gate driving signal output terminal.

14. The display substrate according to claim 13, wherein the clock signal line, the inverted clock signal line and the second level signal line are arranged in sequence along a direction close to the display area;

along the first direction, the third transistor is located between the first transistor and the second transistor;

the fourth transistor is located at a side of the first transistor away from the second level signal line;

the fifth channel portion of the fifth transistor is located between the first channel portion of the first transistor and the fourth channel portion of the fourth transistor, and the orthographic projection of the input electrode of the fifth transistor on the substrate is located between the orthographic projection of the first channel portion of the first transistor on the substrate and the orthographic projection of the fifth channel portion of the fifth transistor on the substrate;

the common connection terminal includes the gate electrode of the second transistor, the output electrode of the fifth transistor is coupled to the gate electrode of the second transistor through the first conductive connection portion, and the first conductive connection portion extends along the first direction;

the first level signal line is located at a side of the fourth channel portion of the fourth transistor away from the second level signal line, and the orthographic projection of the first level signal line on the substrate is located between the orthographic projection of the fourth channel portion of the fourth transistor on the substrate and the orthographic projection of the sixth channel portion of the sixth transistor on the substrate;

the eighth transistor and the seventh transistor are located at a side of the sixth transistor away from the first level signal line.

15. The display substrate according to claim 14, wherein the shift register unit further comprises a third conductive connection portion coupled to the second level signal line, and a fourth conductive connection portion for coupling the gate electrode of the eighth transistor and the gate electrode of the second transistor, the third conductive connection portion and the fourth conductive connection portion both extend along the second direction;

the second electrode plate of the first capacitor extends along the second direction, and an orthographic projection of one end of the second electrode plate of the first capacitor close to the third conductive connection portion on the substrate and the orthographic projection of the third conductive connecting portion on the substrate have a fifth overlapping area, and the end of the second electrode plate of the first capacitor close to the third conductive connecting portion is coupled to the third conductive connection portion through at least one fifth via hole provided in the fifth overlapping area;

an orthographic projection of one end of the second electrode plate of the first capacitor close to the input electrode of the eighth transistor on the substrate and the orthographic projection of the input electrode of the eighth transistor on the substrate have a sixth overlapping area, the end of the second electrode plate of the first capacitor close to the input electrode of the eighth transistor is coupled to the input electrode of the eighth transistor through at least one sixth via hole provided in the sixth overlapping area;

an orthographic projection of the second electrode plate of the first capacitor on the substrate at least partially overlaps the orthographic projection of the fourth conductive connection portion on the substrate, and the fourth conductive connection portion is multiplexed as the first electrode plate of the first capacitor; or wherein the second electrode plate of the second capacitor is located at a side of the seventh channel portion of the seventh transistor away from the first level signal line;

the orthographic projection of the second electrode plate of the second capacitor on the substrate and the orthographic projection of the output electrode of the seventh transistor on the substrate have a seventh overlapping area, the second electrode plate of the second capacitor is coupled to the output electrode of the seventh transistor through a seventh via hole provided in the seventh overlapping area;

the gate electrode of the seventh transistor is multiplexed as the first electrode plate of the second capacitor; or wherein the shift register unit further comprises a fifth conductive connection portion extending along the second direction;

the sixth transistor includes a sixth active pattern, the sixth active pattern extends along the first direction, and the sixth active pattern includes two sixth conductive portions arranged opposite to each other along the first direction, and a sixth channel portion located between the two sixth conductive portions, the orthographic projection of the input electrode of the sixth transistor on the substrate and the orthographic projection of one of the sixth conductive portions on the substrate have an eighth overlapping area, the input electrode of the sixth transistor is coupled to one of the sixth conductive portions through an eighth via hole provided in the eighth overlapping area, and the orthographic projection of the output electrode of the sixth transistor on the substrate and the orthographic projection of the other of sixth conductive portions on the substrate have a ninth overlapping area, and the output electrode of the sixth transistor is coupled to the other of sixth conductive portions through a ninth via hole provided in the ninth overlapping area;

the input electrode of the sixth transistor is respectively coupled to the output electrode of the first transistor and the gate electrode of the fifth transistor through the fifth conductive connection portion.

16. A display device comprising the display substrate according to claim 1.

17. A display substrate, comprising: a substrate, and a gate driving circuit provided on the substrate; the gate driving circuit includes: a frame start signal line, a clock signal line, an inverted clock signal line, a first level signal line, a second level signal line, and a plurality of shift register units, the frame start signal line, the clock signal line, the inverted clock signal line, the first level signal line and the second level signal lines all extend along the first direction;

each of the plurality of shift register unit includes a gate driving signal output terminal, each of the plurality of shift register units includes a plurality of transistors, and the plurality of transistors include a seventh transistor and an eighth transistor arranged along the first direction; the seventh transistor includes a seventh transistor input electrode pattern, a seventh transistor output electrode pattern, and a seventh transistor gate pattern, an orthographic projection of the seventh transistor gate pattern on the substrate is located between the orthographic projection of the input electrode pattern of the seventh transistor on the substrate and the orthographic projection of the seventh transistor output electrode pattern on the substrate, the eighth transistor includes an eighth transistor input electrode pattern and an eighth transistor output electrode pattern and an eighth transistor gate pattern, the orthographic projection of the eighth transistor gate pattern on the substrate is located between the orthographic projection of the eighth transistor input electrode pattern on the substrate and the orthographic projection of the eighth transistor output electrode pattern on the substrate, and the seventh transistor output electrode pattern is multiplexed as the eighth transistor output electrode pattern;

the seventh transistor input electrode pattern, the seventh transistor output electrode pattern, the seventh transistor gate pattern, the eighth transistor input electrode pattern, and the eighth transistor gate pattern all extend along the second direction, and the second direction intersects the first direction;

the seventh transistor output electrode pattern and the eighth transistor output electrode pattern are both coupled to the gate driving signal output terminal; the seventh transistor is used to control the gate driving signal output terminal to output a valid level, the eighth transistor is used to control the gate driving signal output terminal to output an invalid level;

the shift register unit includes a common connection terminal;

the plurality of transistors further include a fourth transistor and a fifth transistor, and an active layer of the fourth transistor and an active layer of the fifth transistor are formed by a continuous second semiconductor layer;

the active layer of the fourth transistor includes two fourth conductive portions arranged opposite to each other, and a fourth channel portion located between the two fourth conductive portions;

the active layer of the fifth transistor includes two fifth conductive portions arranged opposite to each other, and a fifth channel portion located between the two fifth conductive portions;

one of the fourth conductive portions and one of the fifth conductive portions are coupled to form a coupling end, and the coupling end is coupled to the common connection end through a first conductive connection portion.

18. The display substrate according to claim 17, wherein:

the seventh transistor input electrode pattern includes a plurality of first input electrode patterns arranged along the first direction, and a plurality of second input electrode patterns arranged on a same side of the plurality of first input electrode patterns and coupled to the plurality of first input electrode patterns;

the seventh transistor output electrode pattern includes a plurality of first output electrode patterns, and a plurality of second output electrode patterns arranged on a same side of the plurality of first output electrode patterns and respectively coupled to the plurality of first output electrode patterns, the first output electrode patterns and the first input electrode patterns are arranged alternately;

the seventh transistor gate pattern includes a plurality of fourth gate patterns, and a plurality of fifth gate patterns located on a same side of the plurality of fourth gate patterns and respectively coupled to the plurality of fourth gate patterns, each of the plurality of fourth gate patterns is located between the first input electrode pattern and the first output electrode pattern adjacent to each other;

the orthographic projection of the eighth transistor gate pattern on the substrate is located between the orthographic projection of the eighth transistor input electrode pattern on the substrate and the orthographic projection of the eighth transistor output electrode pattern on the substrate, a first output electrode pattern of the seventh transistor closest to the eighth transistor gate pattern is multiplexed as the eighth transistor output electrode pattern;

the first input electrode pattern, the first output electrode pattern, the fourth gate pattern, the eighth transistor gate pattern, and the eighth transistor input electrode pattern all extend along the second direction, and the second direction intersects the first direction.

19. The display substrate according to claim 18, wherein:

the seventh transistor includes two seventh active patterns arranged along the second direction, and each seventh active pattern includes a seventh conductive portion and a seventh channel portion alternately arranged in the first direction;

the seventh channel portions correspond to the fourth gate patterns in one-to-one correspondence, and the orthographic projection of each seventh channel portion on the substrate is located within the orthographic projection of the corresponding fourth gate pattern on the substrate;

one part of the seventh conductive portions of the seventh transistor correspond to the first input electrode patterns in one-to-one correspondence, and the orthographic projection of the first input electrode pattern on the substrate and the orthographic projection of the corresponding seven conductive portions on the substrate have a second overlapping area, and the first input electrode pattern is coupled to the corresponding seventh conductive portion through at least one second via hole provided in the second overlapping area;

the other part of the seventh conductive portions of the seventh transistor correspond to the first output electrode patterns in one-to-one correspondence, and the orthographic projection of the first output electrode pattern on the substrate and the orthographic projection of the corresponding seventh conductive portion on the substrate have a third overlapping area, and the first output electrode pattern is coupled to the corresponding seventh conductive portion through at least one third via hole provided in the third overlapping area;

the eighth transistor includes two eighth active patterns arranged along the second direction, each eighth active pattern includes an eighth conductive portion and an eighth channel portion, the orthographic projection of the eight conductive portion on the substrate and the orthographic projection of the eighth transistor input electrode pattern on the substrate have a fourth overlapping area, the eighth conductive portion is coupled to the eighth transistor input electrode pattern through at least one fourth via hole provided in the fourth overlapping area;

the orthographic projection of the eighth channel portion on the substrate is located within the orthographic projection of the eighth transistor gate pattern on the substrate;

the seventh active patterns correspond to the eighth active patterns in one-to-one correspondence, and the seventh active pattern and the eighth active pattern corresponding to each other are formed by a continuous third semiconductor layer.

20. The display substrate according to claim 17, wherein the plurality of transistors at least include a first transistor, a second transistor, and a third transistor, an active layer of the first transistor, an active layer of the second transistor and an active layer of the third transistor are formed by a continuous first semiconductor layer, the first semiconductor layer extends along the first direction; the first semiconductor layer includes at least three channel portions corresponding to the first transistor, the second transistor, and the third transistor, and conductive portions arranged between adjacent channel portions, the at least three channel portions are arranged along the first direction, and transistors corresponding to the adjacent channel portions are coupled to each other through the corresponding conductive portion.

21. The display substrate according to claim 20, wherein the gate driving circuit further includes a frame start signal line;

the plurality of transistors further include a fourth transistors, a fifth transistor, a sixth transistor, a seventh transistor, and an eighth transistor;

a gate electrode of the first transistor is coupled to the clock signal line, and an input electrode of the first transistor is connected to the frame start signal line, an output electrode of the first transistor is coupled to a gate electrode of the fifth transistor;

an input electrode of the fifth transistor is coupled to the clock signal line, an output electrode of the fifth transistor is coupled to an output electrode of the fourth transistor;

a gate electrode of the fourth transistor is coupled to the clock signal line, an input electrode of the fourth transistor is coupled to the first level signal line, and an output electrode of the fourth transistor is coupled to a gate electrode of the eighth transistor;

an input electrode of the eighth transistor is coupled to the second level signal line, an output electrode of the eighth transistor is coupled to the gate driving signal output terminal;

a gate electrode of the seventh transistor is coupled to an output electrode of the sixth transistor, an input electrode of the seventh transistor is coupled to the inverted clock signal input terminal, and an output electrode of the seventh transistor is coupled to the gate driving signal output terminal;

a gate electrode of the sixth transistor is coupled to the first level signal line, and an input electrode of the sixth transistor is coupled to the output electrode of the first transistor;

the gate electrode of the second transistor is coupled to an output electrode of the fourth transistor, and the input electrode of the second transistor is coupled to the second level signal line, the output electrode of the second transistor is coupled to the input electrode of the third transistor;

the gate electrode of the third transistor is coupled to the inverted clock signal line, the output electrode of the third transistor is coupled to an input electrode of the sixth transistor;

the shift register unit further includes:

a first capacitor, a first electrode plate of the first capacitor is coupled to the gate electrode of the eighth transistor, and a second electrode plate of the first capacitor is coupled to the second level signal line; and a second capacitor, a first electrode plate of the second capacitor is coupled to the gate electrode of the seventh transistor, and a second electrode plate of the second capacitor is coupled to the gate driving signal output terminal.

22. The display substrate according to claim 21, wherein along a direction close to the display area, the clock signal line, the inverted clock signal line, and the second level signal line are arranged in sequence;

along the first direction, the third transistor is located between the first transistor and the second transistor;

the fourth transistor is located a side of the first transistor away from the second level signal line;

the fifth channel portion of the fifth transistor is located between the first channel portion of the first transistor and the fourth channel portion of the fourth transistor, and the orthographic projection of the input electrode of the fifth transistor on the substrate is arranged between the orthographic projection of the first channel portion of the first transistor on the substrate and the orthographic projection of the fifth channel portion of the fifth transistor on the substrate;

the common connection terminal includes the gate electrode of the second transistor, and the output electrode of the fifth transistor is coupled to the gate electrode of the second transistor through the first conductive connection portion, The first conductive connection portion extends along the first direction;

the first level signal line is located on a side of the fourth channel portion of the fourth transistor away from the second level signal line, and the orthographic projection of the first level signal line on the substrate is located between the orthographic projection of the fourth channel portion of the fourth transistor on the substrate and the orthographic projection of the sixth channel portion of the sixth transistor on the substrate;

the eighth transistor and the seventh transistor are located on a side of the sixth transistor away from the first level signal line; or wherein the shift register unit further includes a third conductive connection portion coupled to the second level signal line, and a fourth conductive connection portion for coupling the gate electrode of the eighth transistor and the gate electrode of the second transistor, the third conductive connection portion and the fourth conductive connection portion both extend along the second direction;

the second electrode plate of the first capacitor extends along the second direction, and an orthographic projection of one end of the second electrode plate of the first capacitor close to the third conductive connection portion on the substrate and an orthographic projection of the third conductive connection portion on the substrate have a fifth overlapping area, and the end of the second electrode plate of the first capacitor close to the third conductive connection portion is coupled to the third conductive connection portion through at least one fifth via hole provided in the fifth overlapping area;

an orthographic projection of one end of the second electrode plate of the first capacitor close to the input electrode of the eighth transistor on the substrate, and an orthographic projection of the input electrode of the eighth transistor on the substrate have a sixth overlapping area, and the end of the second electrode plate of the first capacitor close to the input electrode of the eighth transistor is coupled to the input electrode of the eighth transistor through at least one sixth via hole provided in the sixth overlapping area;

the orthographic projection of the second electrode plate of the first capacitor on the substrate at least partially overlaps the orthographic projection of the fourth conductive connecting portion on the substrate, and the fourth conductive connection portion is multiplexed as the first electrode plate of the first capacitor; or wherein:

the second electrode plate of the second capacitor is located at a side of the seventh channel portion of the seventh transistor away from the first level signal line;

the orthographic projection of the second electrode plate of the second capacitor on the substrate and the orthographic projection of the output electrode of the seventh transistor on the substrate have a seventh overlapping area, the second electrode plate of the second capacitor is coupled to the output electrode of the seventh transistor through a seventh via hole provided in the seventh overlapping area;

the gate electrode of the seventh transistor is multiplexed as the first electrode plate of the second capacitor; or wherein the shift register unit further includes a fifth conductive connection portion extending along the second direction;

the sixth transistor includes a sixth active pattern, the sixth active pattern extends along the first direction, and the sixth active pattern includes two sixth conductive portions disposed opposite to each other along the first direction, and a sixth channel portion between the two sixth conductive portions, the orthographic projection of the input electrode of the sixth transistor on the substrate and the orthographic projection of the sixth conductive portion on the substrate have an eighth overlapping area, the input electrode of the sixth transistor is coupled to one of the sixth conductive portions through an eighth via hole provided in the eighth overlapping area, and the orthographic projection of the output electrode of the sixth transistor on the substrate and the orthographic projection of the other sixth conductive portion on the substrate have a ninth overlapping area, and the output electrode of the sixth transistor is coupled to the other sixth conductive portion through a ninth via hole provided in the ninth overlapping area;

the input electrode of the sixth transistor is respectively coupled to the output electrode of the first transistor and the gate electrode of the fifth transistor through the fifth conductive connection portion.

23. The display substrate according to claim 17, wherein the two fourth conductive portions are arranged opposite to each other along the first direction, the two fifth conductive portions are arranged opposite to each other along the second direction, and the second direction intersects the first direction;

the active layer of the fourth transistor and the active layer of the fifth transistor are formed together in an L shape, and the coupling end is located at the corner of the L shape.

\* \* \* \* \*